United States Patent [19]

Terashima

[11] Patent Number: 5,541,430
[45] Date of Patent: Jul. 30, 1996

[54] VDMOS SEMICONDUCTOR DEVICE

[75] Inventor: Tomohide Terashima, Fukuoka, Japan

[73] Assignee: Mitsubishi Denki Kabushiki Kaisha, Tokyo, Japan

[21] Appl. No.: 54,138

[22] Filed: Apr. 30, 1993

[30] Foreign Application Priority Data

Jun. 12, 1992 [JP] Japan .................................. 4-153316

[51] Int. Cl.⁶ ..................... H01L 29/76; H01L 29/74; H01L 29/94; H01L 31/062
[52] U.S. Cl. ..................... 257/342; 257/130; 257/138; 257/341; 257/343; 257/339
[58] Field of Search .................................. 257/130, 138, 257/139, 147, 140, 212, 329, 337, 339, 341, 342, 343; 437/6

[56] References Cited

U.S. PATENT DOCUMENTS

| | | | |
|---|---|---|---|
| 4,393,391 | 7/1983 | Blanchard | 257/343 |
| 4,639,762 | 1/1987 | Neilson et al. | 257/341 |
| 5,034,785 | 7/1991 | Blanchard | 257/341 |
| 5,045,903 | 9/1991 | Meyer et al. | 257/341 |
| 5,091,766 | 2/1992 | Terashima | 257/138 |
| 5,155,569 | 10/1992 | Terashima | 257/130 |
| 5,194,394 | 3/1993 | Terashima | 437/6 |

FOREIGN PATENT DOCUMENTS

| | | | |
|---|---|---|---|
| 0159663 | 10/1985 | European Pat. Off. | 257/133 |
| 0381268 | 8/1990 | European Pat. Off. | 257/341 |
| 0431855 | 6/1991 | European Pat. Off. | 257/345 |
| 2-86171 | 3/1990 | Japan | 257/342 |
| 3-105978 | 5/1991 | Japan | 257/339 |

OTHER PUBLICATIONS

Electronics and Communications in Japan, Part 2, vol. 75, No. 8, 1992, Masatoshi Morikawa, et al., "US–DMOS: A Novel Structrue for Power MOSFETs", pp. 63–67 and 70–71.

IEEE Transactions on Electron Devices, vol. 36, No. 9, Sep. 1989, Chang, et al., "500-V n–Channel Insulated–Gate Bipolar Transistor with a Trench Gate Structure", pp. 1824–1828.

IEEE Transactions on Electron Devices, vol. ED–34, No. 4, Apr. 1987, Daisuke Ueda, et al., "An Ultra–Low On–Resistance Power MOSFET Fabricated by Using a Fully Self–Aligned Process", pp. 926–930.

*Primary Examiner*—Steven H. Loke
*Attorney, Agent, or Firm*—Oblon, Spivak, McClelland, Maier & Neustadt, P.C.

[57] ABSTRACT

In a semiconductor device having a low ON resistance, an $n^-$-type epitaxial layer (1) is formed on an upper surface of an $n^+$-type substrate (8) and p-type diffusion regions (2) are selectively formed on its upper surface, while n-type diffusion regions (3) are further formed on upper surfaces thereof. A gate electrode (5) wrapped up in an oxide film (4) is provided on the upper surface of the $n^-$-type epitaxial layer (1) and above portions of the p-type diffusion regions (2) held between the $n^-$-type epitaxial layer (1) and the $n^+$-type diffusion regions (3). Grooves (9) are formed in the upper surface of the $n^-$-type epitaxial layer (1) located under a gate electrode (5) to extend perpendicularly to junction planes between the $n^-$-type epitaxial layer (1) and the p-type diffusion regions (2). While an ON resistance includes an accumulation resistance (Ra) and a JFET resistance (Rj), these resistances can be reduced since a gate width is increased due to formation of the grooves (9) and a current readily flows downwardly along the grooves (9).

17 Claims, 23 Drawing Sheets

VDMOS SEMICONDUCTOR DEVICE

BACKGROUND OF THE INVENTION

1. Field of the Invention

The present invention relates to a semiconductor device which can control current conducting and inhibiting states by the voltage of a control electrode.

2. Description of the Background Art

FIG. 25 is a sectional view showing the structure of a conventional VDMOS 100, which is a semiconductor device controlling current conducting and inhibiting states by the voltage of a control electrode. An n$^-$-type epitaxial layer 1 is provided on an upper surface of an n$^+$-type substrate 8, while p-type diffusion regions 2 are selectively formed on an upper surface of the n$^-$-type epitaxial layer 1. Further, n$^+$-type diffusion regions 3 are selectively formed in the p-type diffusion regions 2.

A gate electrode 5 wrapped up in an oxide film 4 is provided above the upper surface of the n$^-$-type epitaxial layer 1 and portions of the p-type diffusion regions 2 held between the n-type expitaxial layer 1 and the n$^+$-type diffusion regions 3. Further, a source electrode 6 is provided to be connected to the p-type diffusion regions 2 and the n$^+$-type diffusion regions 3 while being insulated from the gate electrode 5 by the oxide film 4. On the other hand, a drain electrode 7 is connected to the n$^+$-type substrate 8.

When the gate electrode 5 and the source electrode 6 are at the same potentials and the potential of the drain electrode 7 is increased with respect to that of the source electrode 6 in the VDMOS 100 having the aforementioned structure, reverse biases are applied across the p-type diffusion regions 2 and the n$^-$-type epitaxial layer 1.

Therefore, depletion layers which are developed from the boundaries between the p-type diffusion regions 2 and the n$^-$-type epitaxial layer 1 spread toward the n$^-$-type epitaxial layer 1 to hold the voltage. Thus, the VDMOS 100 is held in an OFF state.

FIG. 26 illustrates the conventional VDMOS 100, in which the potential of the gate electrode 5 is increased with respect to the source electrode 6. Assuming that the source electrode 6 is grounded and positive potentials +V1 and +V2 are applied to the gate and drain electrodes 5 and 7 respectively, the surface regions of the p-type diffusion regions 2 held between the n$^+$-type diffusion regions 3 and the n$^-$-type epitaxial layer 1 are n-inverted to form channels. Then, an electronic current Ie starts to flow from the source electrode 6 toward the drain electrode 7 through the channels. Thus, the VDMOS 100 enters a current conducting state (ON state).

When the potential of the gate electrode 5 is again reduced with respect to the source electrode 6, the channels formed in the surface regions of the p-type diffusion regions 2 held between the n$^+$-type diffusion regions 3 and the n$^-$-type epitaxial layer 1 disappear to cut off the electronic current Ie, whereby the VDMOS 100 again enters an OFF state.

In the conventional semiconductor device having the aforementioned structure, the resistance (ON resistance) of the VDMOS 100 in an ON state is formed by a series resistance of channel resistances Rch developed in the channels, an accumulation resistance Ra developed in an accumulation layer which is formed in a portion of the n$^-$-type epitaxial layer 1 close to the gate electrode 5, a JFET resistance Rj developed in a portion of the n$^-$-type epitaxial layer 1 held between tile p-type diffusion regions 2, and an epitaxial resistance Repi developed along the cross direction of the n$^-$-type epitaxial layer 1.

These resistances are explained in detail as follows: When the potential (V1) of the gate electrode 5 is increased with respect to the source electrode 6, n-type inversion layers are formed on surface portions of the p-type diffusion regions 2 which are held between the n$^-$-type epitaxial layer 1 and the n$^+$-type diffusion regions 3 immediately under the gate electrode 5, by an influence from an electric field of the gate electrode 5. In such inversion layers, electrons flow along the surfaces of the p-type diffusion regions 2 to develop resistances, which are defined as the channel resistances Rch.

At this time, electrons are accumulated on a surface portion of the n$^-$-type epitaxial layer 1 immediately under the gate electrode 5 by an influence from the electric field of the gate electrode 5, to form an accumulation layer. In this accumulation layer, electroils flow along the n$^-$-type epitaxial layer 1 develop a resistance, which is defined as the accumulation resistance Ra.

When the potential (V2) of the drain electrode 7 is increased with respect to the source electrode 6, depletion layers extend from the p-type diffusion regions 2 toward the n$^-$-type epitaxial layer 1. When electrons flow from a central portion of the surface portion of the n$^-$-type epitaxial layer 1 which is held between the p-type diffusion regions 2 toward the drain electrode 7, such flow of the electrons is narrowed by the depletion layers. A resistance thus developed is defined as the JFET resistance Rj. In general, this indicates a resistance which is developed from the surface of the n$^-$-type epitaxial layer 1 to the diffusion depths of the p-type diffusion regions 2.

The epitaxial resistance Repi is developed when electrons flow in the n$^-$-type epitaxial layer 1. While portions located immediately under the p-type diffusion regions 2 have low electric current densities, the epitaxial resistance Repi substantially generally depends on the specific resistance, thickness and area of the n$^-$-type epitaxial layer 1. A resistance of the n$^+$-type substrate 8 is so sufficiently lower than these resistances that the same is negligible.

The epitaxial resistance Repi depends on the specific resistance and thickness of the n$^-$-type epitaxial layer 1, while the withstand voltage of the VDMOS 100 is also considerably influenced by the structure of this portion. When the specific resistance and thickness of the n$^-$-type epitaxial layer 1 are reduced in order to reduce the ON resistance, the withstand voltage in an OFF state cannot be maintained at a high value.

On the other hand, it is possible to reduce the channel resistances Rch, the accumulation resistance Ra and the JFET resistance Rj by reducing the widths of the p-type diffusion regions 2 and the gate electrode 5, the depths of the p-type diffusion regions 2, and the like. However, since such a countermeasure also exerts an influence on the withstand voltage in an OFF state, it is necessary to optimize the process and designed dimensions.

Such optimization of the process and designed dimensions is restricted by the accuracy of a fabrication apparatus in the structure of the conventional semiconductor device, and it is difficult to further improve the characteristics.

SUMMARY OF THE INVENTION

A semiconductor device according to the present invention comprises a first conductivity type first semiconductor layer having an upper surface which is provided with at least one groove, at least one second conductivity type second semiconductor layer having an exposed surface which is so selectively exposed on the upper surface of the first semiconductor layer that a boundary line defined between the second semiconductor layer and the first semiconductor layer on the upper surface of the first semiconductor layer is substantially perpendicular to the longitudinal direction of the groove, a control insulating film which is formed on at least an upper surface of the groove, and a control electrode which is formed on the control insulating film.

Preferably, the second semiconductor layer is selectively formed on the upper surface of the first semiconductor layer.

Preferably, the second semiconductor layer is provided in the form of a strip.

Preferably, a plurality of the aforementioned grooves are provided in parallel with each other.

Preferably, distances between the plurality of grooves are so narrow that a depletion layer extending in a portion of the first semiconductor layer under the grooves covers the distances between adjacent ones of the grooves.

Preferably, a plurality of the aforementioned second semiconductor layers are so provided that the groove is formed at least on a surface portion of the first semiconductor layer which is held between the second semiconductor layers.

Preferably, the inventive semiconductor device further comprises a first conductivity type third semiconductor layer which is selectively formed on an upper surface of at least one of the second semiconductor layers holding the groove, and the control insulating film is formed also on portions of the second semiconductor layers which are held between the first and third semiconductor layers.

Preferably, the third semiconductor layer is selectively formed on upper surfaces of both of the second semiconductor layers holding the groove.

Preferably, the groove is formed to extend toward the upper surfaces of the second semiconductor layers.

Preferably, the groove is formed to extend toward an upper surface of the third semiconductor layer.

Preferably, the groove is formed only on the upper surface of the first semiconductor layer.

Preferably, the inventive semiconductor device further comprises a first electrode which is insulated from the control electrode and connected to the second and third semiconductor layers, and a second electrode which is electrically connected to the first semiconductor layer.

Preferably, the inventive semiconductor device further comprises a first conductivity type fourth semiconductor layer, which is formed between the first semiconductor layer and the second electrode, having higher impurity concentration than the first semiconductor layer.

Preferably, the inventive semiconductor device further comprises a second conductivity type fifth semiconductor layer which is formed between the fourth semiconductor layer and the second electrode.

Preferably, the second semiconductor layers are in the form of islands on the upper surface of the first semiconductor layer.

Preferably, every third semiconductor layer is formed to include a part of every groove.

Preferably, the second semiconductor layers are in the form of islands on the upper surface of the first semiconductor layer.

Preferably, the third semiconductor layer is formed on only one of two second semiconductor layers formed in the surface of the first semiconductor layer.

Preferably, the inventive semiconductor device further comprises a first conductivity type fourth semiconductor layer, which is formed between the first semiconductor layer and the second electrode, having higher impurity concentration than the first semiconductor layer.

Preferably, the inventive semiconductor device further comprises a second conductivity type fifth semiconductor layer which is formed between the fourth semiconductor layer and the second electrode.

Preferably, the second semiconductor layers are in the form of islands on the upper surface of the first semiconductor layer.

Preferably, one of the second semiconductor layers and another one of the second semiconductor layers are checkered on the upper surface of the first semiconductor layer.

Preferably, the groove reaches the other one of two second semiconductor layers holding the surface of the first semiconductor layer.

Preferably, the second semiconductor layers are in the form of islands on the upper surface of the first semiconductor layer.

Preferably, one of the second semiconductor layers and another one of the second semiconductor layers are checkered on the upper surface of the first semiconductor layer.

In an alternative embodiment the inventive semiconductor device further comprises a second conductivity type third semiconductor layer. And the second semiconductor layer is formed to include the groove, the first semiconductor layer is selectively formed on an upper surface of the third semiconductor layer, and the control insulating film is also formed on a portion of the first semiconductor layer held between the second and third semiconductor layers.

Preferably, the inventive semiconductor device further comprises a first electrode which is insulated from the control electrode and connected to the first and second semiconductor layers, and a second electrode which is electrically connected to the third semiconductor layer.

Preferably, the inventive semiconductor device further comprises a second conductivity type fourth semiconductor layer, which is formed between the third semiconductor layer and the second electrode, having higher impurity concentration than the third semiconductor layer.

Preferably, the inventive semiconductor device further comprises a first conductivity type fifth semiconductor layer which is formed between the fourth semiconductor layer and the second electrode.

Preferably, the first semiconductor layer is in the form of an island on an upper surface of the third semiconductor layer.

Preferably, the groove is formed also over the first semiconductor layer and the third semiconductor layer on an upper surface of the third semiconductor layer.

Preferably, the first semiconductor layer is in the form of an island on the upper surface of the third semiconductor layer.

The present invention is also directed to a method of fabricating a semiconductor device comprising the steps of (a) forming a mask having an opening on a first conductivity type first semiconductor layer, (b) forming a groove on the surface of the first semiconductor layer through the mask, (c) forming a control insulating film on the surface of the first semiconductor layer, (d) forming a control electrode on the control insulating film in the groove and in the vicinity thereof, and (e) introducing a second conductivity type impurity into the first semiconductor layer using the control electrode as a mask through the control insulating film for selectively forming a second conductivity type second semiconductor layer.

Preferably, the inventive method of fabricating a semiconductor device further comprises the steps of (f) selectively forming a first conductivity type third semiconductor layer on the surface of the second semiconductor layer, (g) forming a first electrode which is insulated from the control electrode and connected to the second and third semiconductor layers, and (h) forming a second electrode which is electrically connected to the first semiconductor layer.

In the basic structure of the inventive semiconductor device, a current flowing across the first semiconductor layer and the second semiconductor layer passes through an accumulation layer and a channel which are formed immediately under the control electrode. In the basic structure of the inventive semiconductor device, the groove which is formed on the upper surface of the first semiconductor layer increases the sectional area of the accumulation layer or the channel as viewed from the direction of the current flow, whereby an accumulation or channel resistance is reduced.

Further, the current easily flows along the wall of the groove, whereby the distance of the current flow in a region, which is ready to cause a JFET resistance, of the first semiconductor layer close to the second semiconductor layer is substantially reduced. Thus, the value of the JFET resistance is reduced.

In a first mode of the semiconductor device according to the present invention, a current flows from the third semiconductor layer into the first semiconductor layer through a channel which is formed in the vicinity of the surface of the second semiconductor layer and through an accumulation layer which is formed in the vicinity of the upper surface of the first semiconductor layer. The groove formed on the surface of the first semiconductor layer increases the sectional area of the accumulation layer as viewed from the direction of the current flow, whereby the accumulation resistance is reduced. Further, the current easily flows along the wall of the groove, whereby the distance of the current flow in the region, being ready to cause the JFET resistance, of the first semiconductor layer close to the second semiconductor layer is reduced. Thus, the value of the JFET resistance is reduced.

Particularly when the groove is formed over a part of one third semiconductor layer to a part of another third semiconductor layer through the first and second semiconductor layers which are held therebetween, the sectional area of a channel formed in the vicinity of the surface of the second semiconductor layer as viewed from the direction of the current flow is increased, whereby the channel resistance is also reduced.

In a second mode of the semiconductor device according to the present invention, the current flows across the third and fourth semiconductor layers through a channel which is formed in the vicinity of the surface of the second semiconductor layer. A first groove which is formed on a surface portion of the second semiconductor layer held between the third and fourth semiconductor layers increases the sectional area of the channel as viewed from the direction of the current flow, whereby the channel resistance is reduced. Further, the current also flows across the first and fourth semiconductor layers through a channel which is formed in the vicinity of the surface of the second semiconductor layer. A second groove which is formed on a surface portion of the second semiconductor layer held between the first and fourth semiconductor layers increases the sectional area of the channel as viewed from the direction of the current flow, whereby the channel resistance is reduced.

In a third mode of the semiconductor device according to the present invention, the current flows across the second and fourth semiconductor layers through a channel which is formed in the vicinity of the surface of the first semiconductor layer. The groove which is formed on the upper surface of the first semiconductor layer increases the sectional area of the channel as viewed from the direction of the current flow, whereby the channel resistance is reduced. Particularly when the groove reaches the fourth semiconductor layer, it is possible to reduce the resistance of a current electrode formed by the fourth semiconductor layer.

In each of the first to third modes of the present invention, when a depletion layer, which extends when the first or second semiconductor layer under the control electrode has an inversion layer, refines to cover the grooves, a component, which is in a direction perpendicular to the control electrode, of an electric field in the inversion layer formed under the control electrode is relieved. Thus, mobility of electrons flowing in the accumulation layer is improved.

According to the present invention, as hereinabove described, the groove is formed on the upper surface of the first semiconductor layer, whereby it is possible to reduce the accumulation resistance, the channel resistance or the JFET resistance with respect to the current flowing across the first and second semiconductor layers, thereby obtaining a semiconductor device having a low ON resistance without damaging a withstand voltage in an OFF state, with no requirement for high accuracy of a fabrication apparatus. Further, it is possible to obtain a semiconductor device having a low holding voltage and a large maximum controllable current.

According to the inventive method of fabricating a semiconductor device, further, it is possible to provide a method which is suitable for fabricating the aforementioned semiconductor device.

Accordingly, an object of the present invention is to obtain a semiconductor device having a low ON resistance without damaging a withstand voltage in an OFF state, with no requirement for high accuracy of a fabrication apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
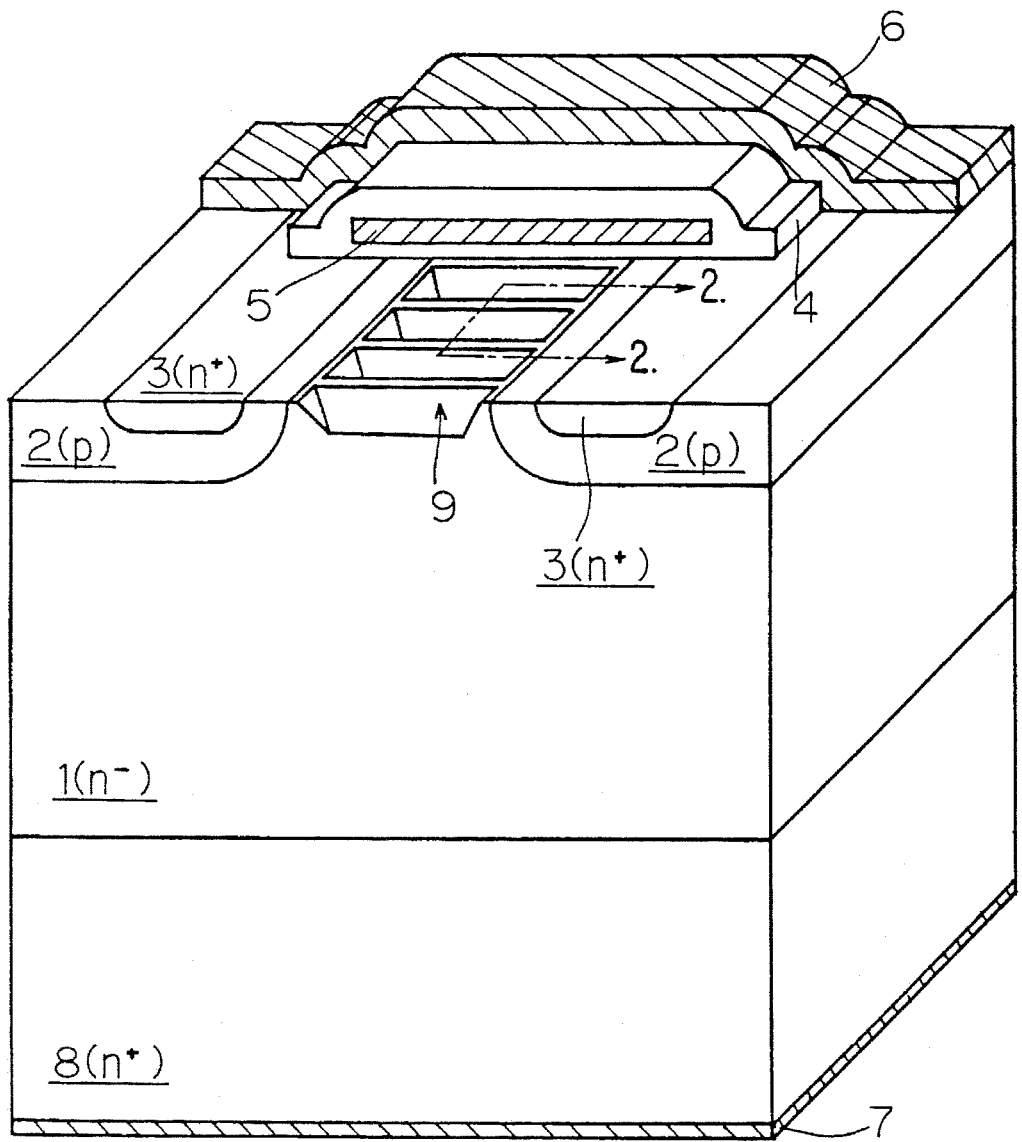
FIG. 1 is a partially fragmented perspective view showing a first embodiment of the present invention.

FIG. 1 is a partially fragmented perspective view showing a VDMOS 101, which is a semiconductor device according to a first embodiment of the present invention. An $n^-$-type epitaxial layer 1 is provided on an upper surface of an $n^+$-type substrate 8, while a plurality of p-type diffusion regions 2 are selectively formed on an upper surface of the $n^-$-type epitaxial layer 1 in the form of strips. Further, $n^+$-type diffusion regions 3 are selectively formed in the p-type diffusion regions 2 in the form of strips.

A gate electrode 5 which is wrapped up in an oxide film 4 is provided above the upper surface of the $n^-$-type epitaxial layer 1 and portions of the p-type diffusion regions 2 held between the same and the $n^+$-type diffusion regions 3.

A source electrode 6 is insulated from the gate electrode 5 by the oxide film 4 and connected to the p-type diffusion regions 2 and the $n^+$-type diffusion regions 3. On the other hand, a drain electrode 7 is connected to the $n^+$-type substrate 8.

In the $n^-$-type epitaxial layer 1, grooves 9 are formed on a surface portion which is held between the adjacent p-type diffusion regions 2. In order to illustrate the structures of these grooves 9, the oxide film 4, the gate electrode 5 and the source electrode 6, which are formed on the grooves 9 in practice, are partially omitted in FIG. 1.

Figure 2:
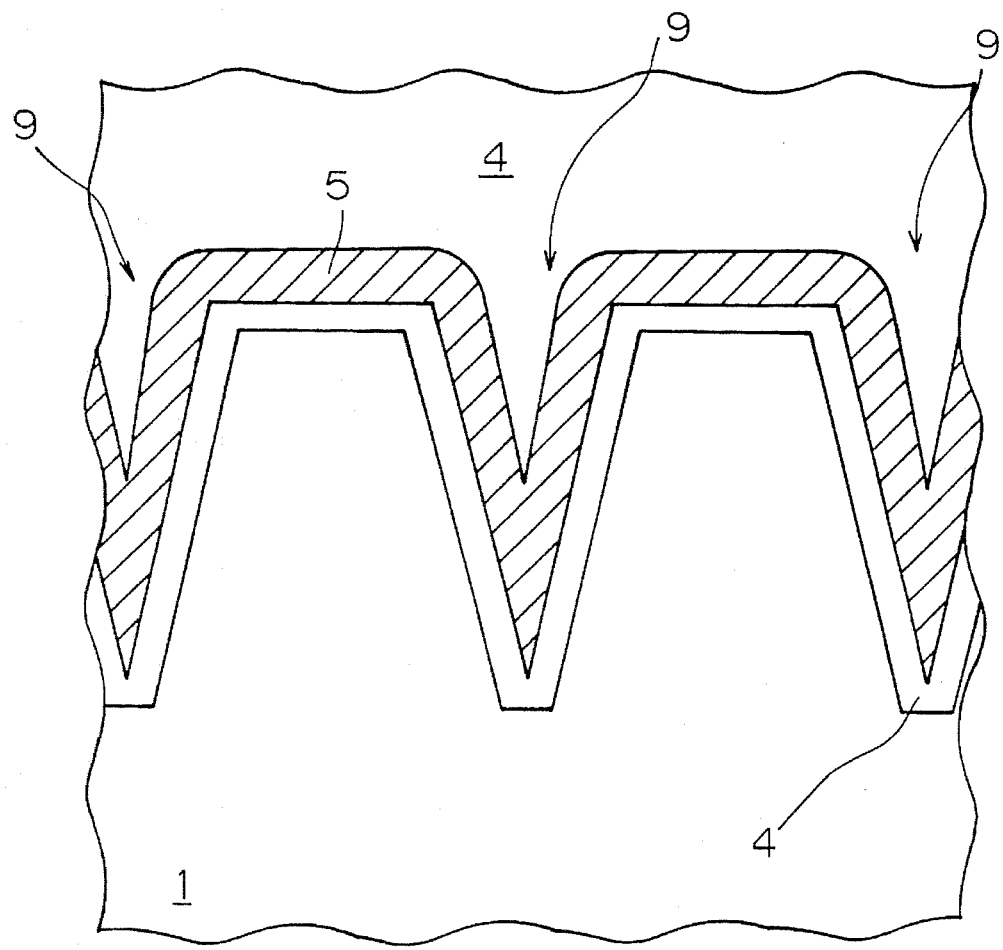
FIG. 2 is a local sectional view showing the first embodiment of the present invention.

FIG. 2 is a sectional view taken along the line A–A' in FIG. 1 for clarifying the structures of the grooves 9. These grooves 9 extend in the $n^-$-type epitaxial layer 1 along a direction perpendicular to boundary lines defined between the $n^-$-type epitaxial layer 1 and the p-type diffusion regions 2.

In an OFF state, the VDMOS 101 operates similarly to the conventional semiconductor device. When the gate electrode 5 and the source electrode 6 are at the same potentials and the potential of the drain electrode 7 is increased with respect to the source electrode 6, reverse biases are applied across the p-type diffusion regions 2 and the $n^-$-type epitaxial layer 1. Depletion layers thus developed in the boundaries between the p-type diffusion regions 2 and the $n^-$-type epitaxial layer 1 spread toward the $n^-$-type epitaxial layer 1, to hold the voltage.

Figure 3:
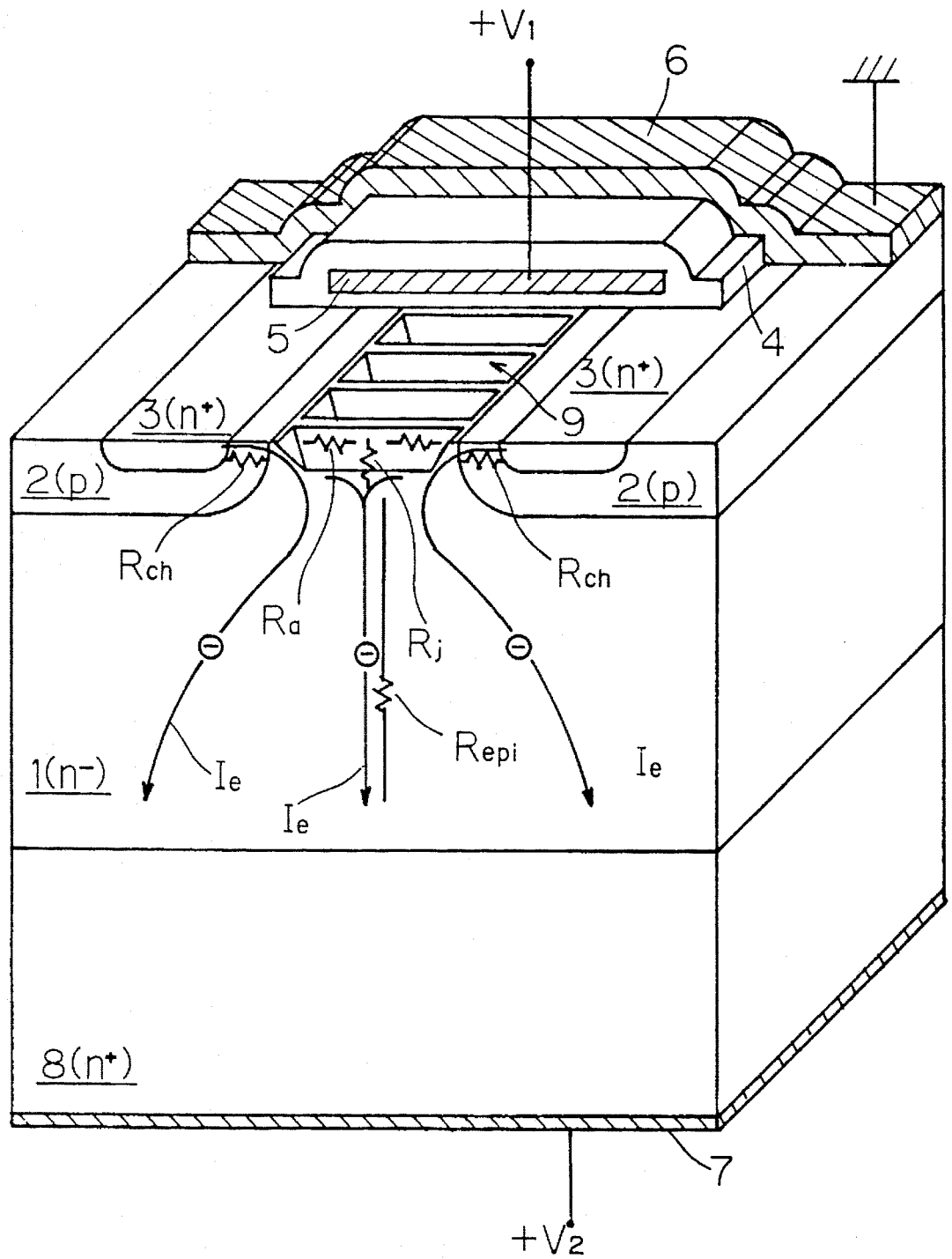
FIG. 3 is a partially fragmented perspective view illustrating the operation of the first embodiment of the present invention.

FIG. 3 illustrates electrons flowing when the potential of the gate electrode 5 is increased with respect to the source electrode 6. Assuming that the source electrode 6 is grounded and positive potentials +V1 and +V2 are applied to the gate and drain electrodes 5 and 7 respectively, surface portions of the p-type diffusion regions 2 which are held between the $n^+$-type diffusion regions 3 and the $n^-$-type epitaxial layer 1 are n-inverted to form channels. An electron current Ie starts to flow from the source electrode 6 toward the drain electrode 7 through the channels. FIG. 3 also shows the electron current Ie which flows when the VDMOS 101 enters an ON state. Referring to FIG. 3, circles provided with negative signs denote electrons. This also applies to other drawings.

The ON resistance of the VDMOS 101 is formed by series connection of channel resistances Rch, an accumulation resistance Ra, a JFET resistance Rj and an epitaxial resistance Repi, similarly to the conventional VDMOS 100. Since the $n^{31}$-type epitaxial layer 1 is provided with the grooves 9, the surface area of a boundary surface between the $n^-$-type epitaxial layer 1 and the oxide film 4 is increased. Thus reduced is the accumulation resistance Ra, which is caused by an accumulation layer formed in the vicinity of the surface of the $n^-$-type epitaxial layer 1. In a portion of the $n^-$-type epitaxial layer 1 which is held between the p-type diffusion regions 2, further, the current easily flows toward the drain electrode 7 along wall surfaces of the grooves 9. Thus, a substantial distance of the current flow through the portion of the $n^-$-type epitaxial layer 1 which is held between the p-type diffusion regions 2 is so reduced that the JFET resistance Rj is reduced by the depths of the grooves 9 in this portion of the $n^-$-type epitaxial layer 1. Thus, it is possible to reduce the sum (Ra+Rj) of the accumulation resistance Ra and the JFET resistance Rj. When the potential of the gate electrode 5 is again reduced with respect to the source electrode 6, the channels formed on the surface portions of the p-type diffusion regions 2 held between the $n^+$-type diffusion regions 3 and the $n^-$-type epitaxial layer 1 disappear to cut off the electronic current Ie similarly to the conventional VDMOS 100, whereby the VDMOS 101 again enters an OFF state.

Figure 4:
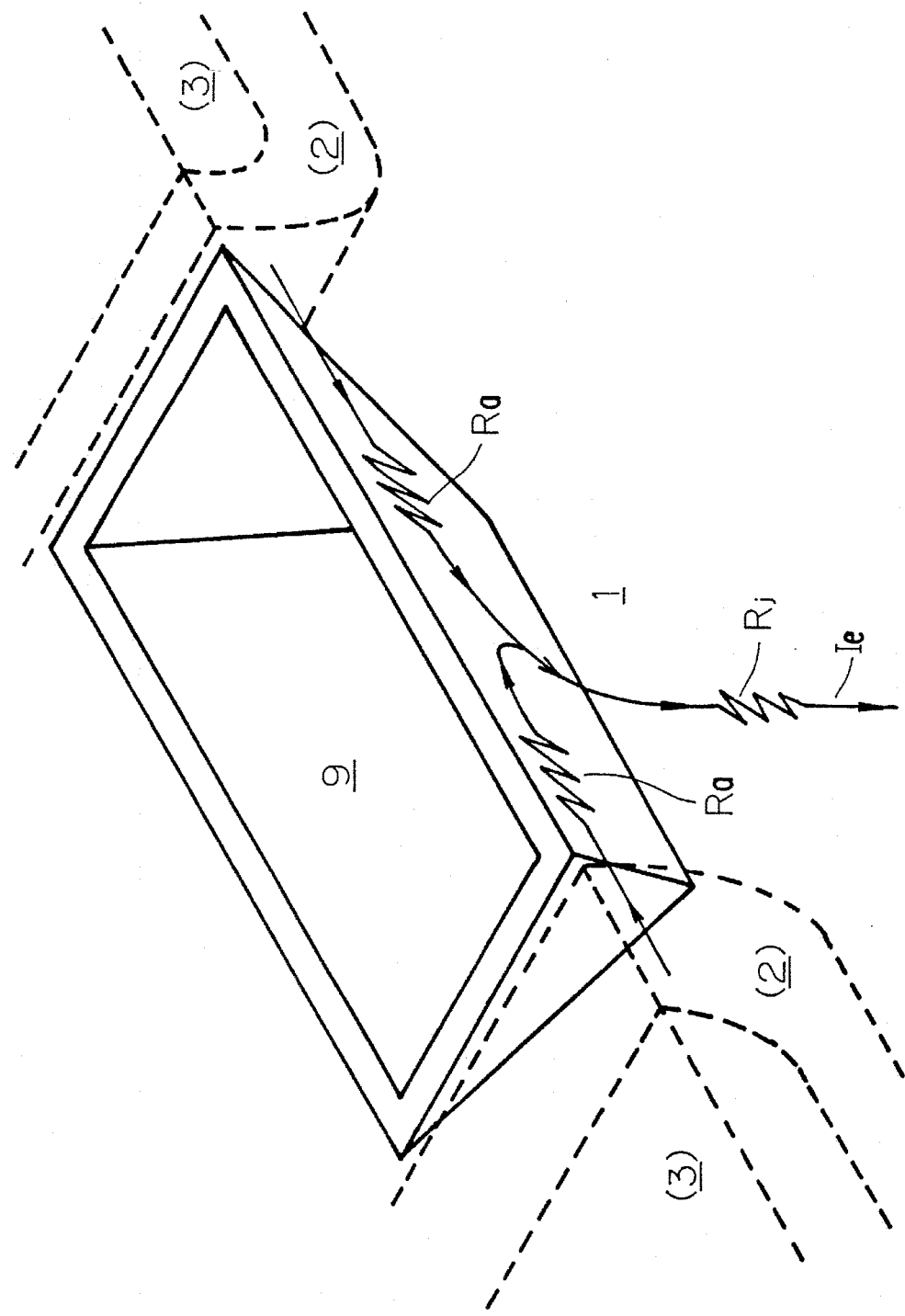
FIG. 4 is a partially fragmented perspective view illustrating the operation of the first embodiment of the present invention.

FIG. 4 schematically illustrates a portion around a groove 9, for further clarifying the flow of the electronic current Ie. For the purpose of simplification, the oxide film 4 and the gate electrode 5, which are provided on the groove 9 in practice, are omitted while the p-type diffusion regions 2 and the $n^+$-type diffusion regions 3 are shown with broken lines.

The electronic current Ie flowing out from the p-type diffusion regions 2 flows in an accumulation layer which is formed along the wall surface of the groove 9 by the gate electrode 5 (not shown in FIG. 4) in the n⁻-type epitaxial layer 1. As compared with the prior art, the sectional area of the accumulation layer is increased as viewed from the electronic current Ie, whereby the accumulation resistance Ra is reduced.

Further, the electronic current Ie flows toward the drain electrode 7 along the wall surface of the groove 9, whereby the substantial distance of its flow in the portion of the n⁻-type epitaxial layer 1 held between the p-type diffusion regions 2 is so reduced that the JFET resistance Rj is reduced by the depth of the groove 9.

According to the first embodiment, the n⁻-type epitaxial layer 1 is thus provided with the grooves 9, whereby it is possible to reduce the ON resistance without controlling the thickness and impurity concentration of the n⁻-type epitaxial layer 1.

When the space between the adjacent p-type diffusion regions 2 is reduced in the conventional semiconductor device, the JFET resistance Rj is increased since the sectional area of the n⁻-type epitaxial layer 1 is reduced with respect to the current flowing from the accumulation layers to the lower surface of the n⁻-type epitaxial layer 1. In the portion of the n⁻-type epitaxial layer 1 which is held between the adjacent p-type diffusion regions 2 causing the JFET resistance Rj in structure, however, in the first embodiment, the current flows through the wall surfaces of the grooves 9. Therefore, substantially no problem arises in relation to the JFET resistance Rj even if the patterns of the p-type diffusion regions 2 are further refined, and hence it is possible to improve the integration density.

Figure 5:
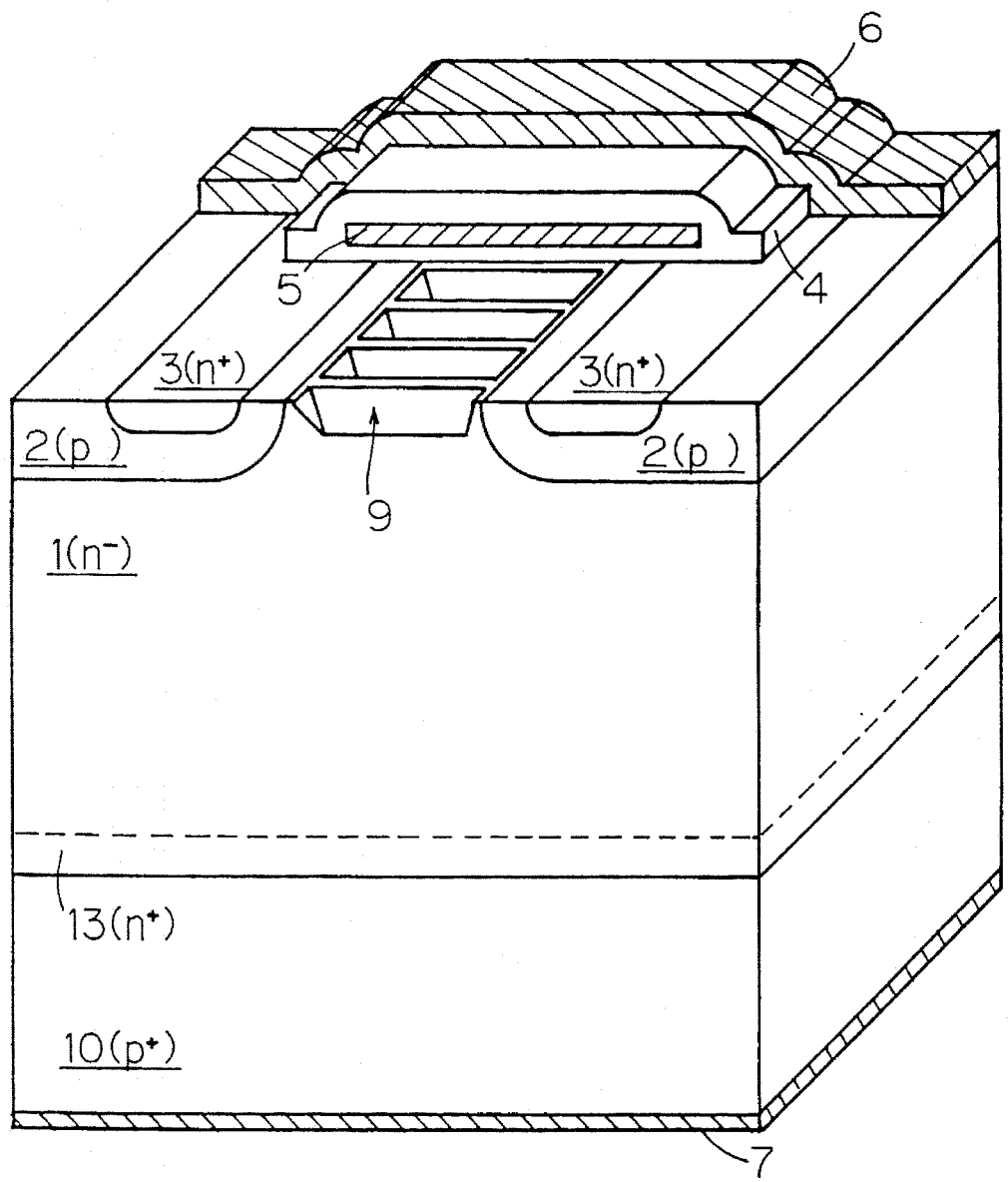
FIG. 5 is a partially fragmented perspective view showing a modification of the first embodiment of the present invention.

Adaptations to semiconductor devices having other structures may be taken such as the n⁻-type epitaxial layer is provided with the grooves 9. For example, FIG. 5 is a partially fragmented perspective view showing the structure of an IGBT 102 according to a modification of the present invention.

This IGBT 102 is identical in structure to the VDMOS 101 in an upper portion of an n⁻-type epitaxial layer 1. However, an n⁺-type layer 13 is provided under the n⁻-type epitaxial layer 1, while a drain electrode 7 is connected to this n⁺-type layer 13 through a p⁺-type substrate 10.

In an operating state of the IGBT 102, electrical conductivity is modulated in the n⁻-type epitaxial layer 1 by injection of holes from the p⁺-type substrate 10, whereby a low ON resistance is implemented. While the n⁻-type epitaxial layer 1 has a high resistance in the IGBT 102, such resistance of the n⁻-type epitaxial layer 1 is reduced upon conductivity modulation, whereby a great effect is attained according to the present invention.

Similarly to the VDMOS 101, the ON resistance of the IGBT 102 is also formed by series connection of channel resistances Rch, an accumulation resistance Ra, a JFET resistance Rj and an epitaxial resistance Repi. In an ON state, most of the holes injected from the p⁺-type substrate 10 pass through the n⁻-type epitaxial layer 1 to thereafter reach an electrode 6 through p-type diffusion regions 2 without flowing through an accumulation layer and channels.

However, the conductivity modulation depends on the value of an electronic current which is supplied to the p⁺-type substrate 10 and the electrons flow through the accumulation layer and the channels. Therefore, the conductivity modulation mainly depends on the channel resistance Rch, which are the resistance of the electronic current, and the accumulation resistance Ra. Thus, it is clearly understood that the ON resistance of the IGBT 102 can also be effectively reduced by providing grooves 9 in the n⁻-type epitaxial layer 1 and reducing the channel resistances Rch and the accumulation resistance Ra.

FIGS. 6 to 11 are sectional views showing a method of fabricating a semiconductor device which comprises an n⁻-type epitaxial layer 1 provided with such grooves 9, with reference to the VDMOS 101.

Figure 6:
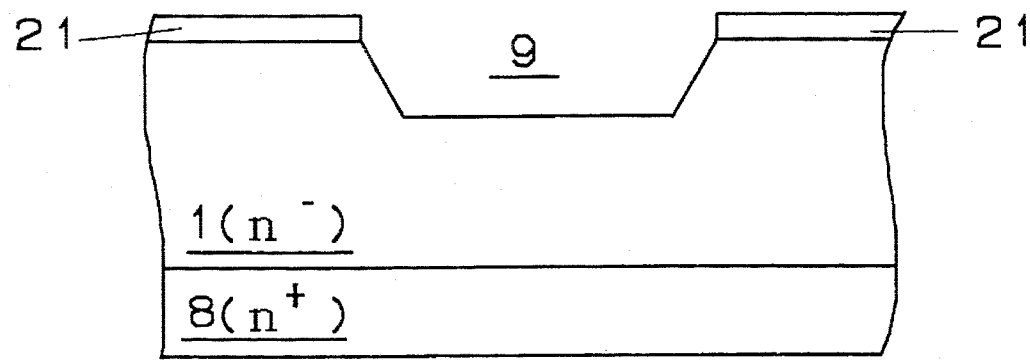
FIGS. 6 to 11 are sectional views illustrating a method of fabricating the semiconductor device according to the first embodiment of the present invention along steps.

An n⁻-type epitaxial layer 1 is deposited on an n⁺-type substrate 8 of silicon, for example, to be oriented along the (100) plane, and a silicon nitride film 21 is formed thereon. This silicon nitride film 21 is patterned by photolithography and employed as a mask to anisotropically etch the n⁻-type epitaxial layer 1 with KOH or the like, thereby forming grooves 9 (FIG. 6).

Figure 7:
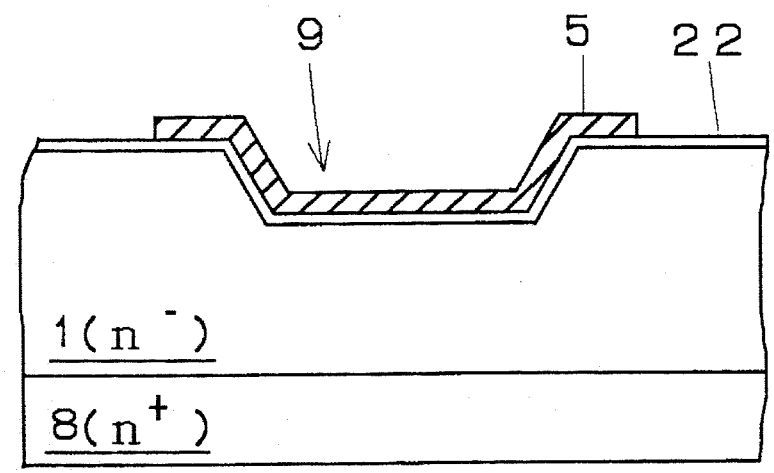

The silicon nitride film 21 is removed and an oxide film 22 is formed by thermal oxidation. A polysilicon film is formed thereon and selectively etched to leave a gate electrode 5 along the grooves 9 and in the vicinity thereof (FIG. 7).

Figure 8:
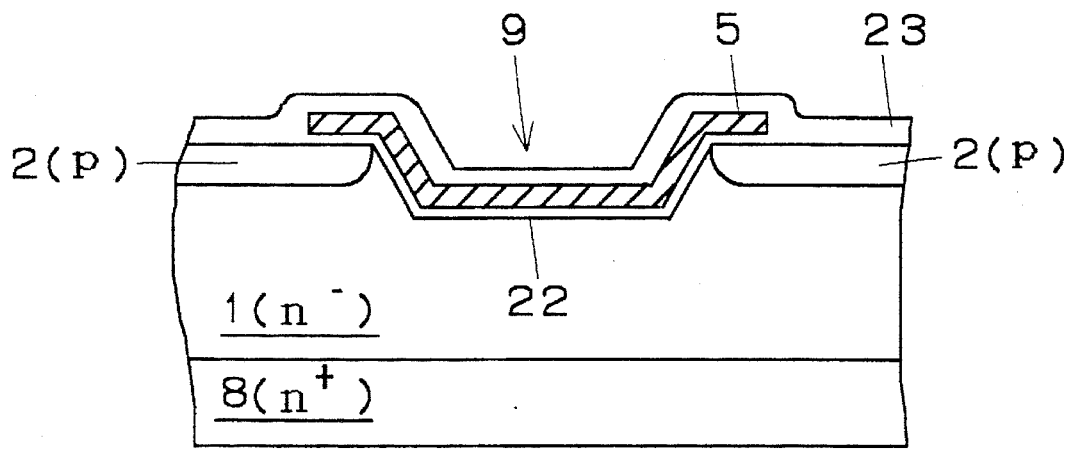

Then boron is injected through the gate electrode 5 serving as a mask, and p-type diffusion regions 2 are selectively formed in the n⁻-type epitaxial layer 1 by annealing. An oxide film 23 is formed during such annealing (FIG. 8).

Figure 9:
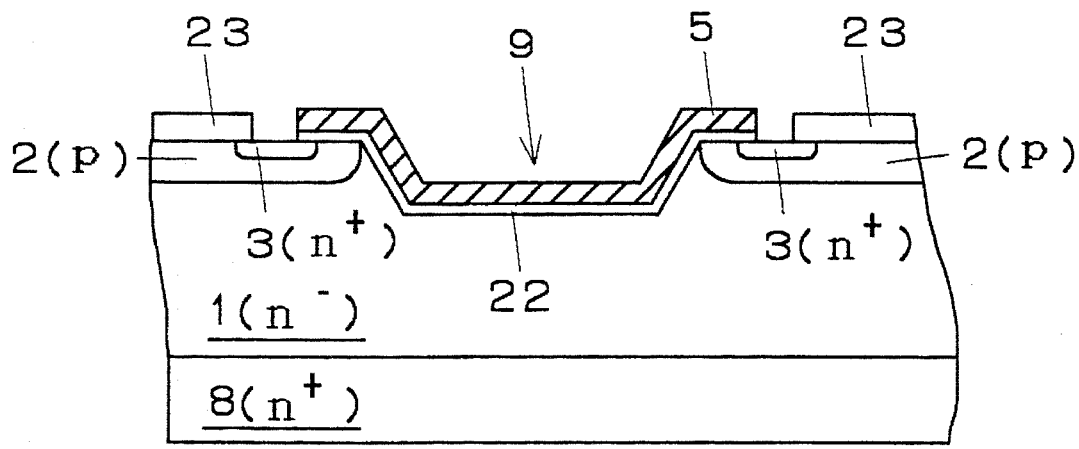

The oxide film 23 is patterned by photolithography, arsenic is injected through the oxide film 23 and the gate electrode 5 serving as masks, and n⁺-type diffusion regions 3 are formed in the p-type diffusion regions 2 by annealing (FIG. 9).

Figure 10:
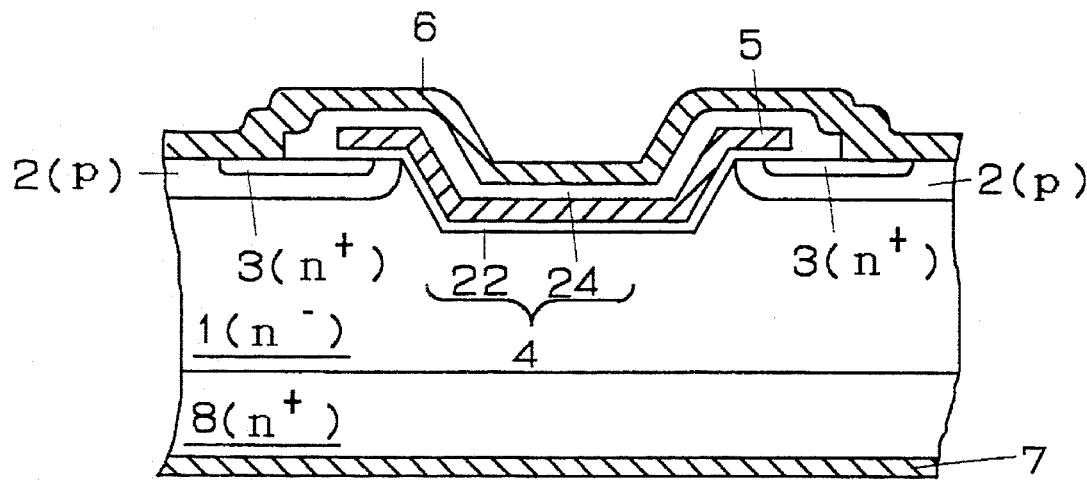

Then an oxide film 24 is formed to complete an oxide film 4 wrapping up the gate electrode 5 with the oxide film 22. The oxide film 24 is selectively removed to expose the p-type diffusion regions 2 and the n⁺-type diffusion regions 3, and sputtering is performed with aluminum to form a source electrode 6. Further, a drain electrode 7 is formed on the back surface of the n⁺-type substrate 8 by vacuum deposition (FIG. 10).

Figure 11:
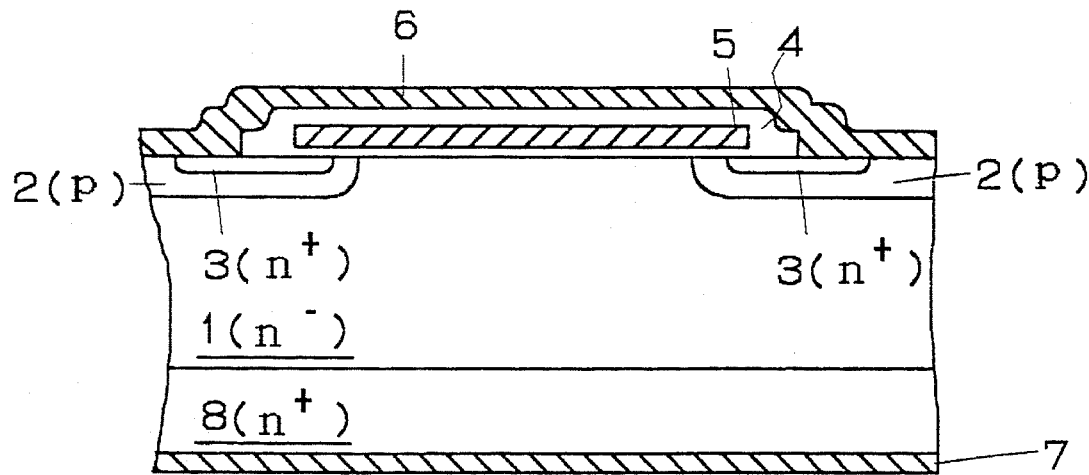

While FIGS. 6 to 10 show fabrication steps with reference to a section through one of the grooves 9, FIG. 11 shows another section through a portion provided with no such groove 9.

Second Embodiment

Figure 12:
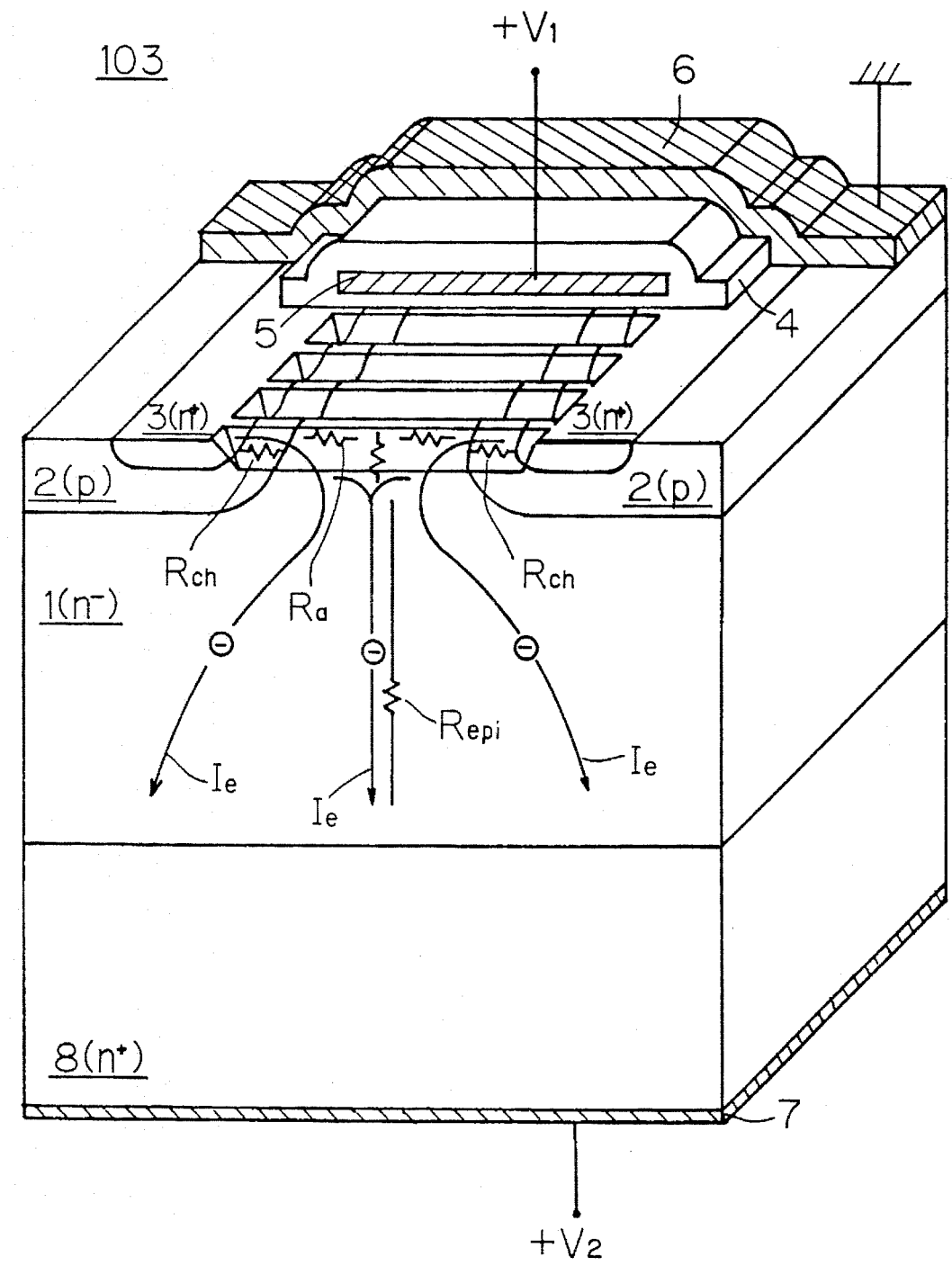
FIG. 12 is a local sectional view showing a second embodiment of the present invention.

FIG. 12 is a partially fragmented perspective view showing a VDMOS 103 according to a second embodiment of the present invention.

In the second embodiment, grooves 9 formed in a portion of an n⁻-type epitaxial layer 1 which is held between p-type diffusion regions 2 reach portions of the p-type diffusion regions 2 which are held between the n⁻-type epitaxial layer 1 and n⁺-type diffusion regions 3.

In this case, gate widths are equivalently increased in the p-type diffusion regions 2, whereby it is possible to reduce not only an accumulation resistance Ra and a JFET resistance Rj but channel resistances Rch. Thus, it is possible to further reduce an ON resistance.

Third Embodiment

Figure 13:
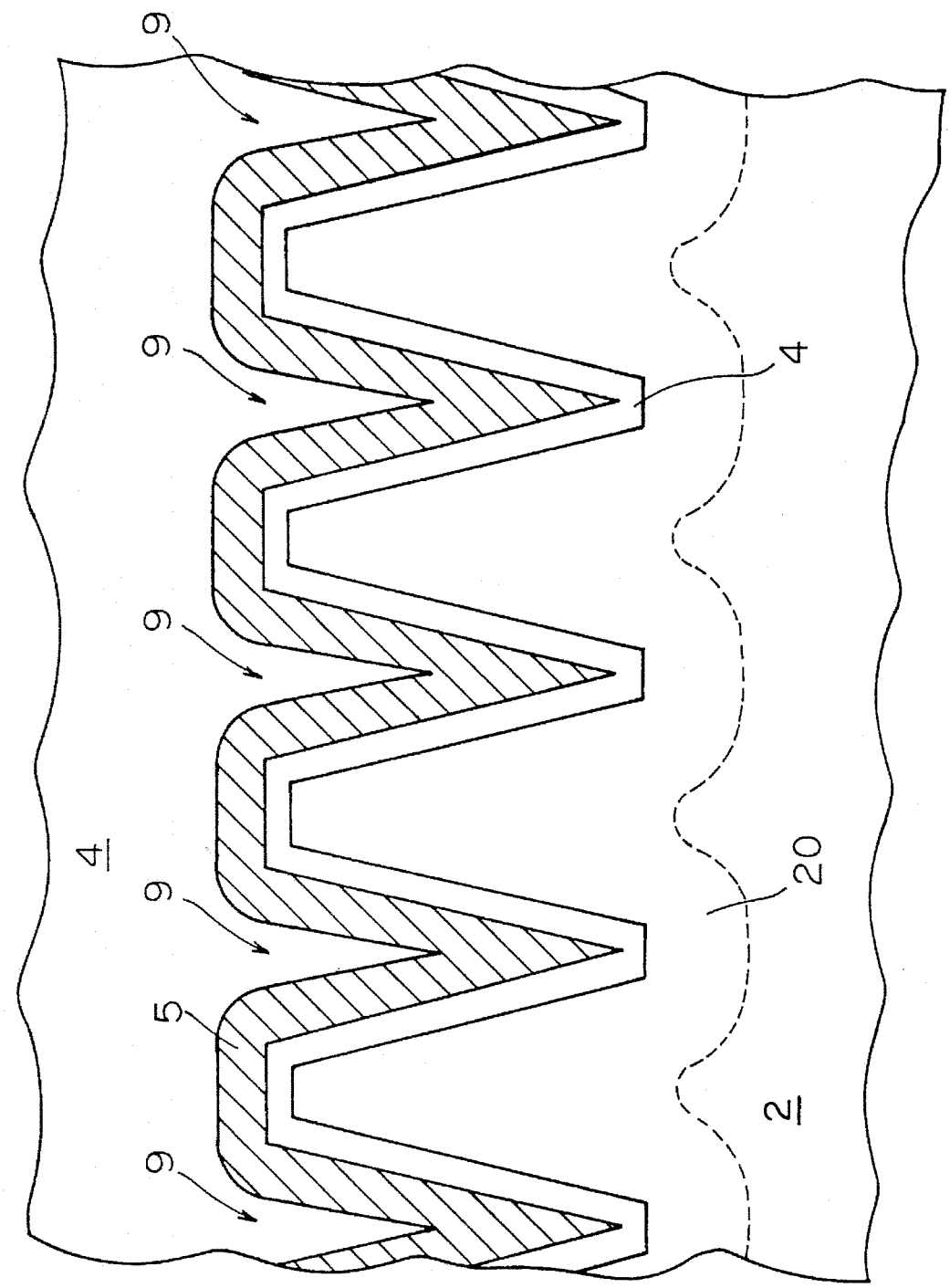
FIG. 13 is a partially fragmented perspective view showing a third embodiment of the present invention.

FIG. 13 is a sectional view showing a third embodiment of the present invention in a portion along grooves 9 which is provided on the p-type diffusion region 2 as viewed from a direction of an electronic current Ie. When a plurality of such grooves 9 are provided between p-type diffusion regions 2 at relatively wide intervals, a depletion layer 20, which extends when the p-type diffusion region 2 has an inversion layer, is formed in a shape extremely reflecting those of the grooves 9, as shown in FIG. 2.

When the grooves 9 are so remarkably refined that a portion of the p-type diffusion region 2 which is held between each adjacent pair of such grooves 9 is not more than several 100 Å in width as shown in FIG. 13, however, the portions of the p-type diffusion region 2 which are held between the grooves 9 are completely depleted.

While an $n^+$-type accumulation layer is formed in a surface portion of the p-type diffusion region 2 close to a gate electrode 5, a component of an electric field formed in the inversion layer perpendicular to the surface of the gate electrode 5 is relieved by the effect which is caused by the depletion of the p-type diffusion region 2 held between the grooves 9. And the electric field perpendicular to an electric current Ie is reduced in the inversion layer, whereby mobility of electrons forming the electronic current Ie is increased. Thus, it is possible to further reduce a channel resistance Rch.

It is clear that such refinement of the grooves 9 is also effective for the IGBT 102 shown in FIG. 5.

Fourth Embodiment

Figure 14:
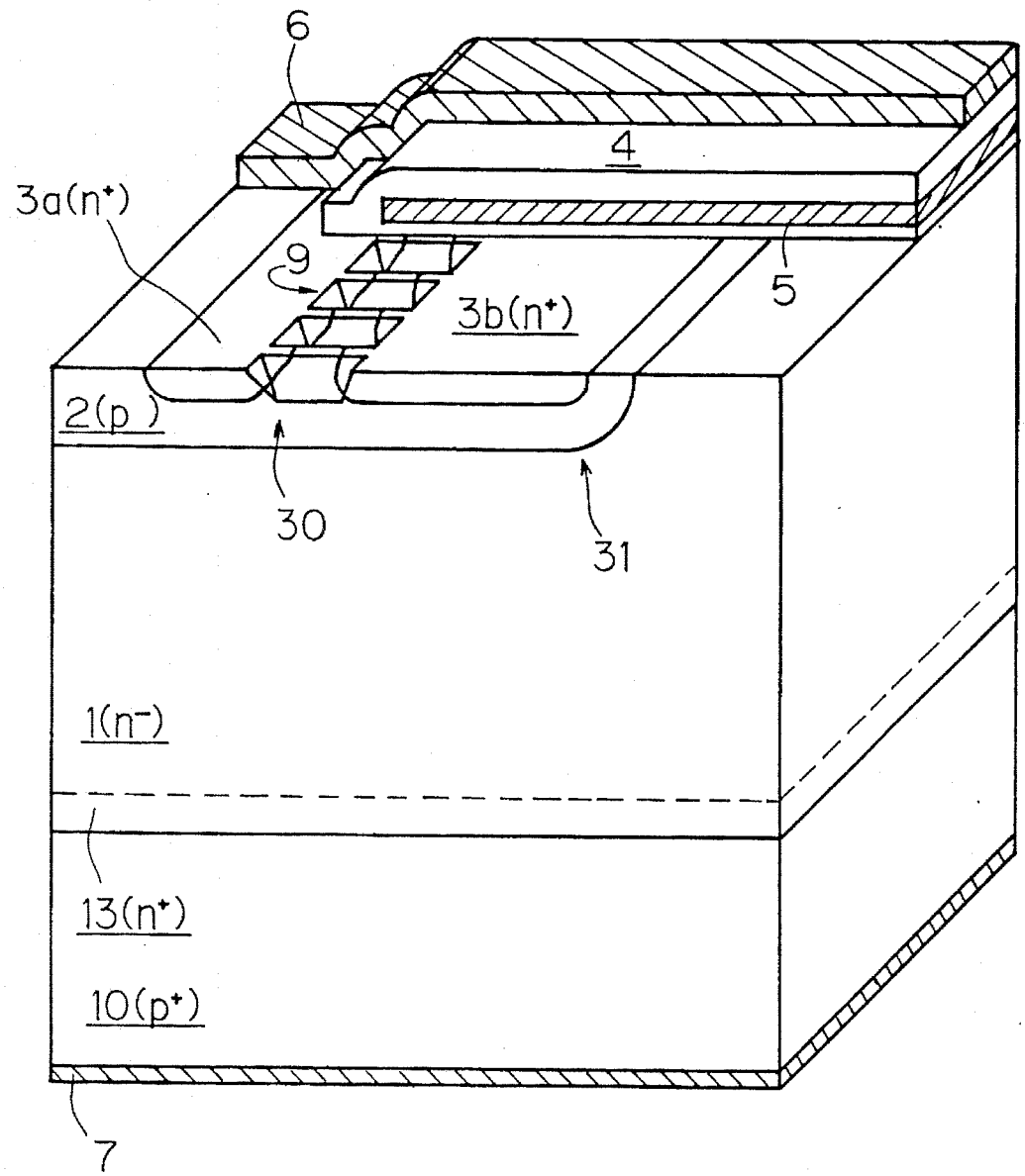
FIG. 14 is a partially fragmented perspective view showing a fourth embodiment of the present invention.

FIG. 14 is a partially fragmented perspective view showing the structure of an EST (emitter switched thyristor) 104 according to a fourth embodiment of the present invention. This EST 104 is identical in structure to the IGBT 102 shown in FIG. 4 in a lower portion of an $n^-$-type epitaxial layer 1. On the other hand, p-type diffusion regions 2 are selectively formed in an upper surface of the $n^-$-type epitaxial layer 1, while $n^+$-type diffusion regions 3a and 3b are selectively formed in upper surfaces of the p-type diffusion regions 2.

Grooves 9 are formed in parts of the $n^+$-type diffusion regions 3a and 3b and upper surface portions of the p-type diffusion regions 2 held therebetween. A gate electrode 5 which is wrapped up in an oxide film 4 is formed above the $n^-$-type epitaxial layer 1, then $n^+$-type diffusion regions 3b, and the p-type diffusion regions 2. Held between the $n^-$-type epitaxial layer 1 in the $n^+$-type diffusion 3b and the grooves 9.

A source electrode 6 is connected to the p-type diffusion regions 2 and the $n^+$-type diffusion region 3a, while a drain electrode 7 is connected to the back surface of a $p^+$-type substrate 10. Each of the grooves 9 is identical in structure to that shown in FIG. 2 in a section perpendicular to the longitudinal direction.

The EST 104 operates in a series-connected state of a thyristor operating region which is formed by the $n^+$-type diffusion region 3a, the p-type diffusion regions 2, the $n^-$-type epitaxial layer 1 and the $p^+$-type substrate 10, and an n-channel channel MOS transistor 30 which is formed by the $n^+$-type diffusion regions 3a and 3b and the portions of the p-type diffusion regions 2 held therebetween. An electronic current flowing in the thyristor operating region is entirely supplied from the transistor 30, whereby it is possible to reliably bring the thyristor operating region into an OFF state by turning off the transistor 30 while implementing reduction of an ON resistance of the EST 104 by a thyristor operation. Thus, it is possible to simply drive the EST 104.

When the grooves 9 are formed in at least portions of the p-type diffusion regions 2 which are held between the $n^+$-type diffusion regions 3a and 3b similarly to the first embodiment, the gate width of the n-channel MOS transistor 30 is effectively increased so that its ON resistance can be reduced. On the other hand, current density in an ON state of the EST 104 remarkably depends on current drivability of the transistor 30, whereby the ON resistance of the EST 104 can be reduced.

Particularly when the grooves 9 are formed to reach the $n^+$-type diffusion regions 3a and 3b as shown in FIG. 14, it is possible to more preferably reduce the resistance of a current electrode of the transistor 30.

Figure 15:
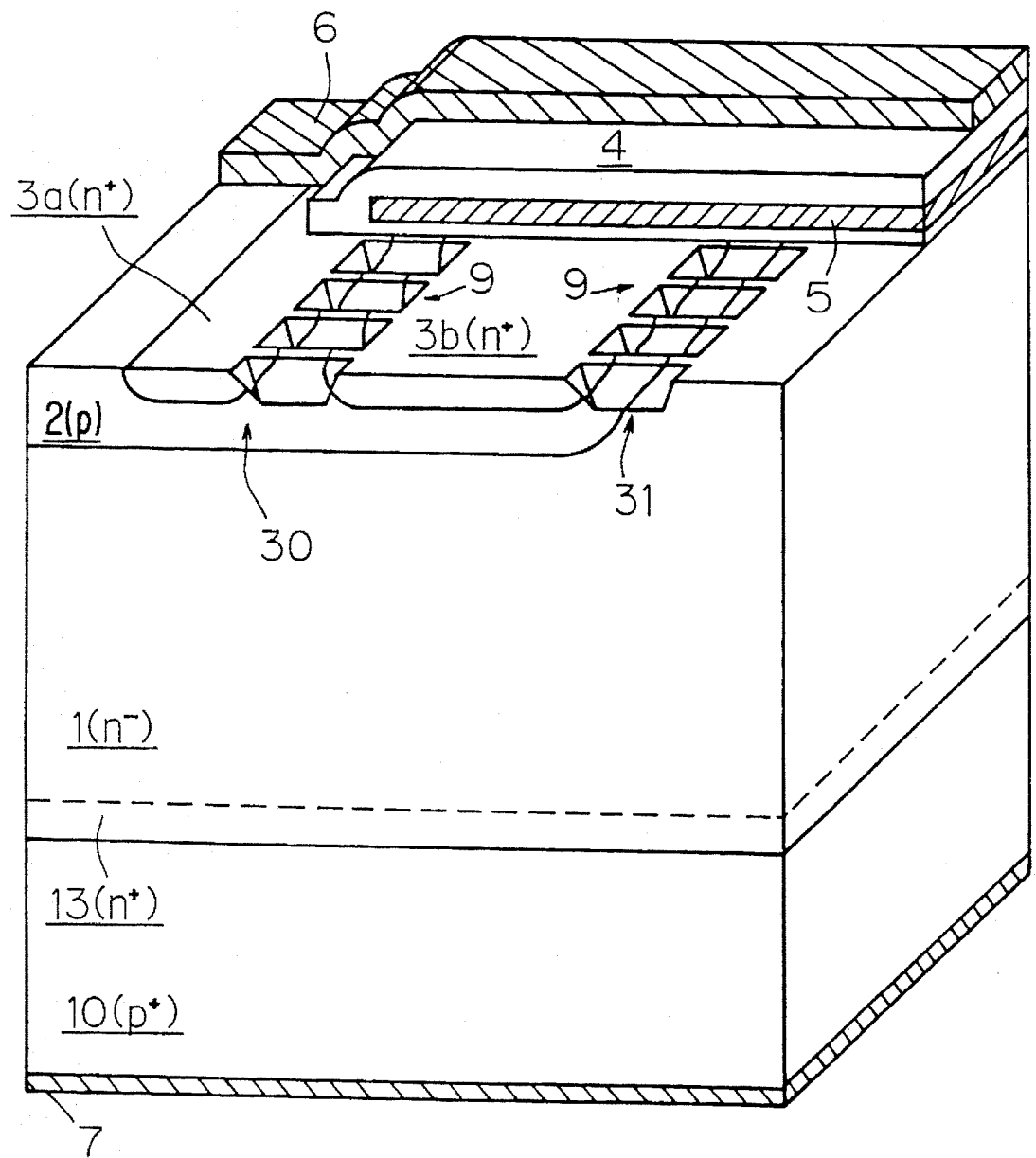
FIG. 15 is a partially fragmented perspective view showing another modification of the fourth embodiment of the present invention.

FIG. 15 is a partially fragmented perspective view showing an EST 105 according to another modification of the present invention. In addition to the structure of the EST 104, this EST 105 is provided with grooves 9 also in portions of p-type diffusion regions 2 which are held between an $n^+$-type diffusion region 3b and an $n^-$-type epitaxial layer 1. The $n^+$-type diffusion region 3b, the $n^-$-type epitaxial layer 1 and the portions of the p-type diffusion regions 2 held therebetween form an n-channel MOS transistor 31. This is adapted to supply an electronic current to a $p^+$-type substrate 10 in a turn-on state (the transistor 31 is also turned on), thereby igniting a thyristor operation. When the grooves 9 are also formed in the portions of the p-type diffusion regions 2 which are held between the $n^+$-type diffusion region 3b and the $n^-$-type epitaxial layer 1 as in the EST 105, therefore, current drivability of the transistor 31 is so increased that it is possible to reduce a holding voltage in the thyristor operation.

Figure 16:
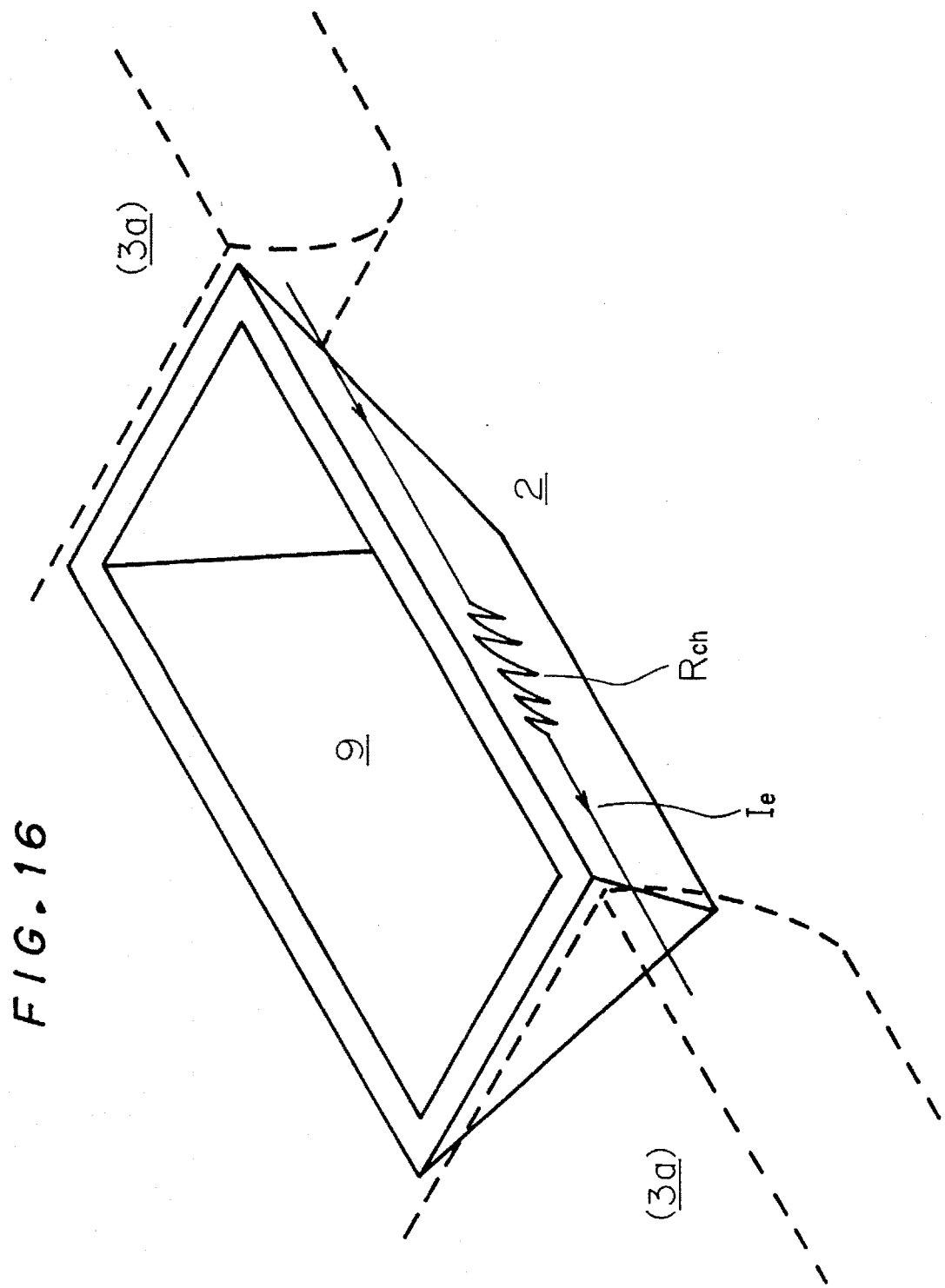
FIG. 16 is a partially fragmented perspective view illustrating the operation of the other modification of the present invention.

FIG. 16 is a partially fragmented perspective view showing a portion around one of the grooves 9 provided in the EST 105. It is understood that the present invention is applicable not only to an element carrying a current toward lower portions of the grooves 9 but to an element carrying a current only along side surfaces of the grooves 9, i.e., a horizontal element having a MOS structure.

Also in the fourth embodiment, it is possible to further reduce channel resistance Rch by extremely refining the grooves 9 to reduce the widths of the potions of the p-type diffusion region 2 held between the grooves 9 to several 100 Å, similarly to the second embodiment.

Fifth Embodiment

Figure 17:
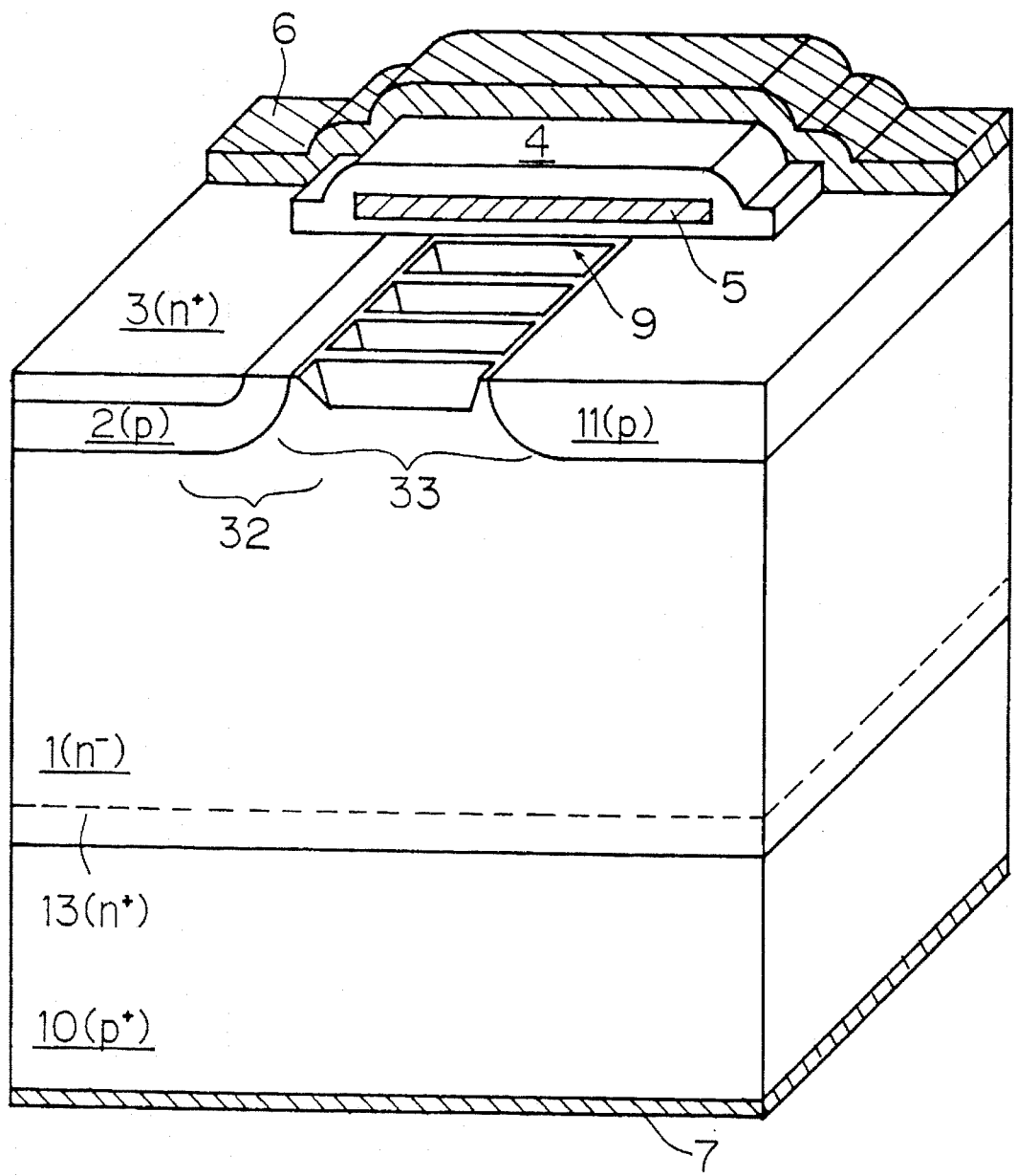
FIG. 17 is a partially fragmented perspective view showing a fifth embodiment of the present invention.

FIG. 17 is a partially fragmented perspective view showing the structure of an MCT (MOS controlled thyristor) 106 according to a fifth embodiment of the present invention. While the MCT 106 is similar in structure to the IGBT 102 shown in FIG. 4, a p-type diffusion region 11 is formed in place of the right p-type and $n^+$-type diffusion regions 2 and 3 of the IGBT 102.

In such a structure, a thyristor operating region which is formed by an $n^+$-type diffusion region 3, a p-type diffusion region 2, an $n^-$-type epitaxial layer 1 and a $p^+$-type substrate 10 is so turned on that the MCT 106 also enters an ON state.

A turn-on operation is performed by turning on an n-channel MOS transistor 32 which is formed by the $n^+$-type diffusion region 3, the $n^-$-type epitaxial layer 1 and a portion of the p-type diffusion region 2 which is held therebetween. When the transistor 32 is turned on, an electronic current is supplied to the $p^+$-type substrate 10, to ignite the thyristor operating region.

A turn-off operation is performed by turning off another p-channel MOS transistor 33 which is formed by the p-type diffusion regions 2 and 11 and a portion of the $n^-$-type epitaxial layer 1 held therebetween. When the transistor 33 is turned on, a hole current which is injected from the p-type diffusion region 2 into the n⁺-type diffusion region 3 is so bypassed as to are-extinguish the thyristor operating region.

In the fifth embodiment, grooves 9 are formed in the n⁻-type epitaxial layer 1 serving as a current electrode of the transistor 32, whereby an ON resistance of the transistor 32 is reduced. Thus, the thyristor operating region readily enters a thyristor operation, and it is possible to reduce the holding voltage thereof.

In a turn-off state, a channel of the transistor 33 is formed in the upper surface of the n⁻-type epitaxial layer 1, i.e., the grooves 9, whereby its channel resistance is reduced and it is possible to increase the maximum control current (maximum current capable of turning off).

In other words, it is possible to increase the area of the thyristor operating region by reduction of the ON resistance of the transistor 33, whereby it is possible to reduce the ON resistance of the MCT 106.

Figure 18:
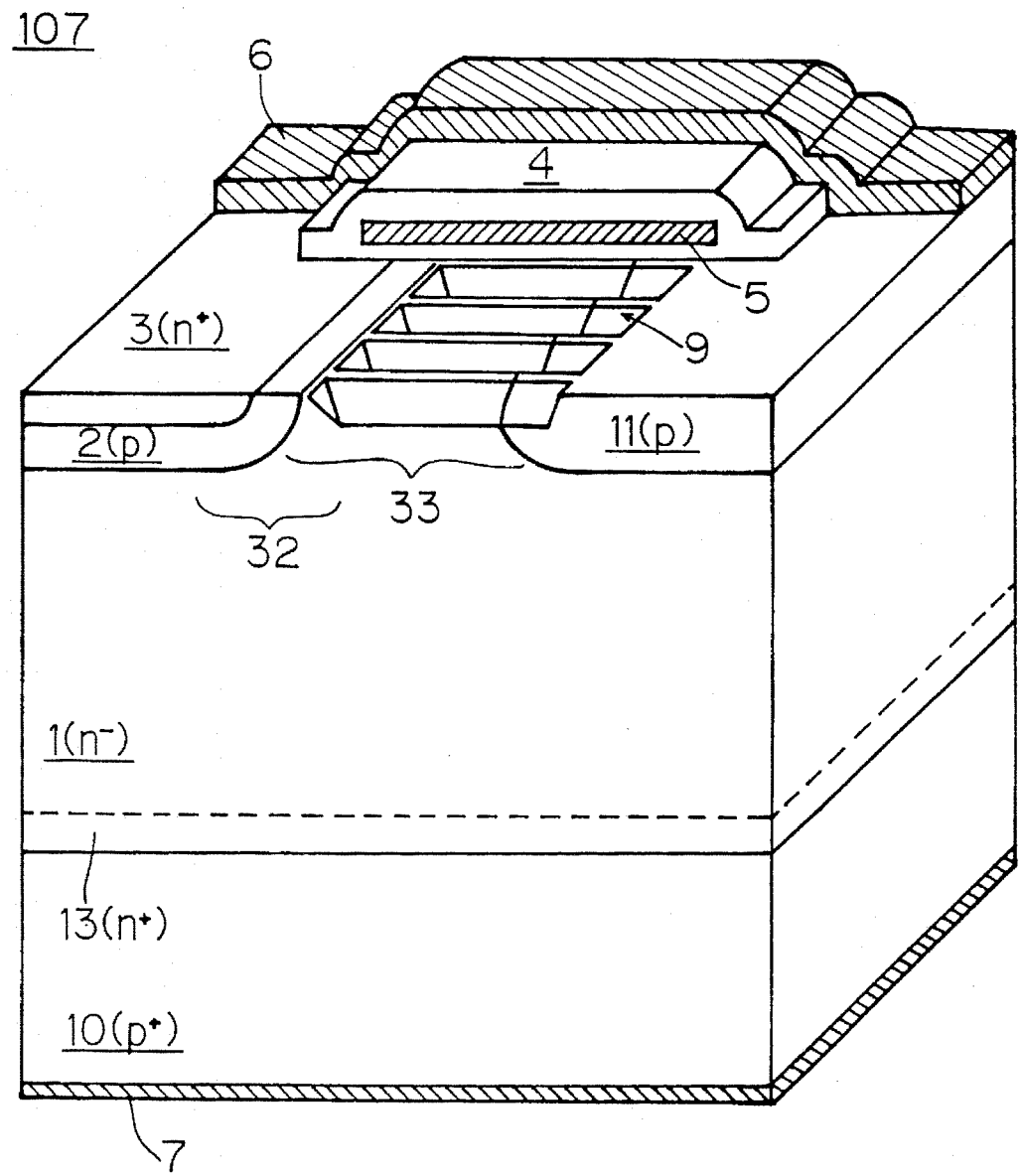
FIG. 18 is a partially fragmented perspective view showing still another modification of the fifth embodiment of the present invention shown in FIG. 17.

FIG. 18 is a partially fragmented perspective view showing an MCT 107 according to still another modification of the present invention. Grooves 9 are formed to reach a p-type diffusion region 11 thereby reducing the resistance of a current electrode of a transistor 33 similarly to a transistor 32, whereby the maximum control current can be more effectively increased.

Also in the fifth embodiment, it is possible to extremely refine the grooves 9 for reducing portions of the n⁻-type epitaxial layer 1 which are held between the grooves to several 100 Å in width, thereby further reducing the channel resistance in these portions.

Sixth Embodiment

Figure 19:
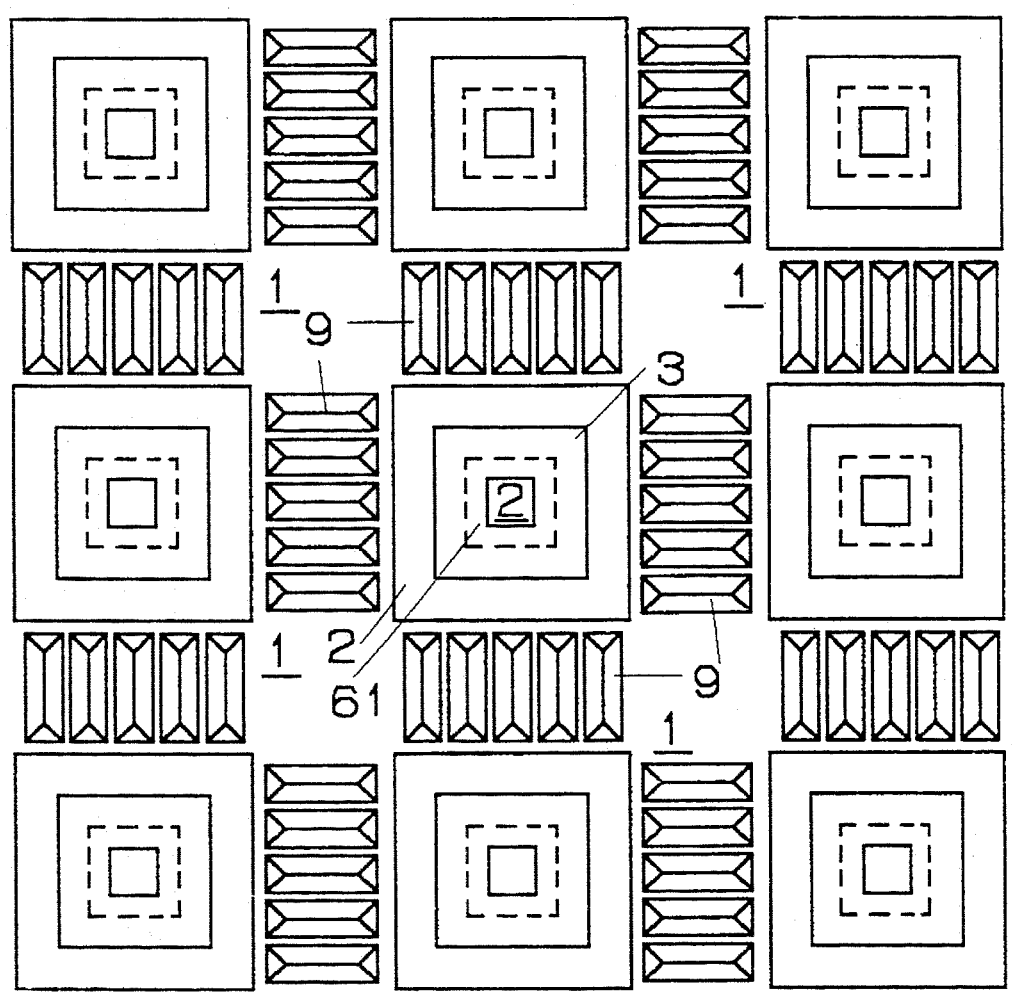
FIG. 19 is a plan view showing a sixth embodiment of the present invention.

FIG. 19 is a plan view showing semiconductor devices according to a sixth embodiment of the present invention. The sixth embodiment corresponds to the VDMOS 101 (shown in FIG. 1) or the IGBT 102 (shown in FIG. 4) according to the first embodiment. In each of the semiconductor devices, an n⁺-type substrate 8 (not shown) or a p⁺-type substrate 10 (not shown) is formed under an n⁻-type epitaxial layer 1. While an oxide film 4, a gate electrode 5 and a source electrode 6 are omitted in FIG. 19 for the purpose simplification, the source electrode 6 is connected to a p-type diffusion region 2 and an n⁺-type diffusion region 3 in a region 61 enclosed by broken lines.

While the p-type and n⁺-type diffusion regions 2 and 3 are provided in the form of strips in the VDMOS 101 and the IGBT 102, the p-type and n⁺-type diffusion regions 2 and 3 have cell structures in the sixth embodiment. Thus, the operation of this embodiment is similar to that described above with reference to the first embodiment, and a similar effect is attained.

Particularly as to a VDMOS element, it has been recognized that an ON resistance can be further reduced in a cell structure as compared with a strip-shaped structure in general, and it is preferable to employ the mode of the sixth embodiment having cell structures.

Seventh Embodiment

Figure 20:
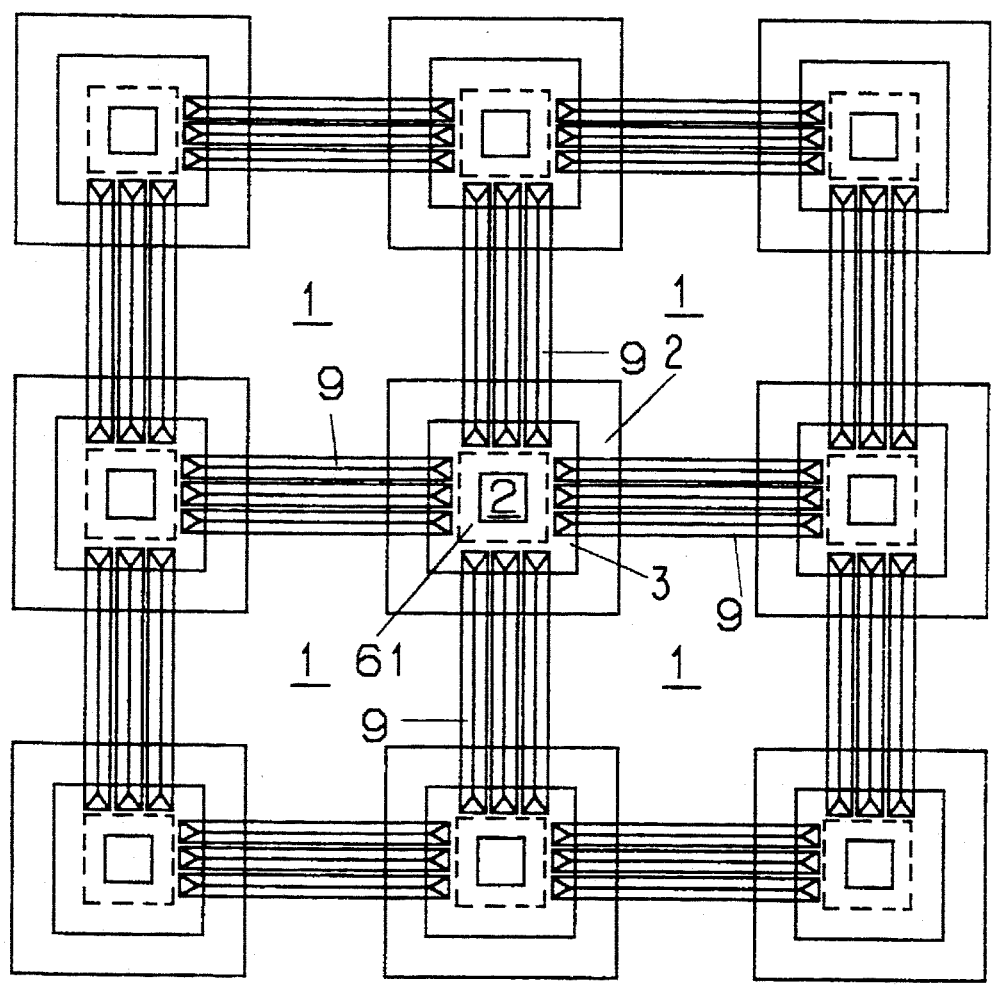
FIG. 20 is a plan view showing a seventh embodiment of the present invention.

FIG. 20 is a plan view showing a seventh embodiment of the present invention. The seventh embodiment corresponds to the VDMOS 103 (shown in FIG. 13) according to the third embodiment. An n⁺-type substrate 8 (not shown) is formed under an n⁻-type epitaxial layer 1. While an oxide film 4, a gate electrode 5 and a source electrode 6 are omitted in FIG. 20 for the purpose of simplification, the source electrode 6 is connected to p-type and n⁺-type diffusion regions 2 and 3 in a region 61 enclosed by broken lines.

While the p-type and n⁺-type diffusion regions 2 and 3 are provided in the form of strips in the VDMOS 103, p-type and n⁺-type diffusion regions 2 and 3 of the seventh embodiment have cell structures. Thus, the operation of the seventh embodiment is similar to that described above with reference to the second embodiment, and a similar effect is attained.

As described above, a VDMOS clement is preferably in the mode of the seventh embodiment having cell structures.

Eighth Embodiment

Figure 21:
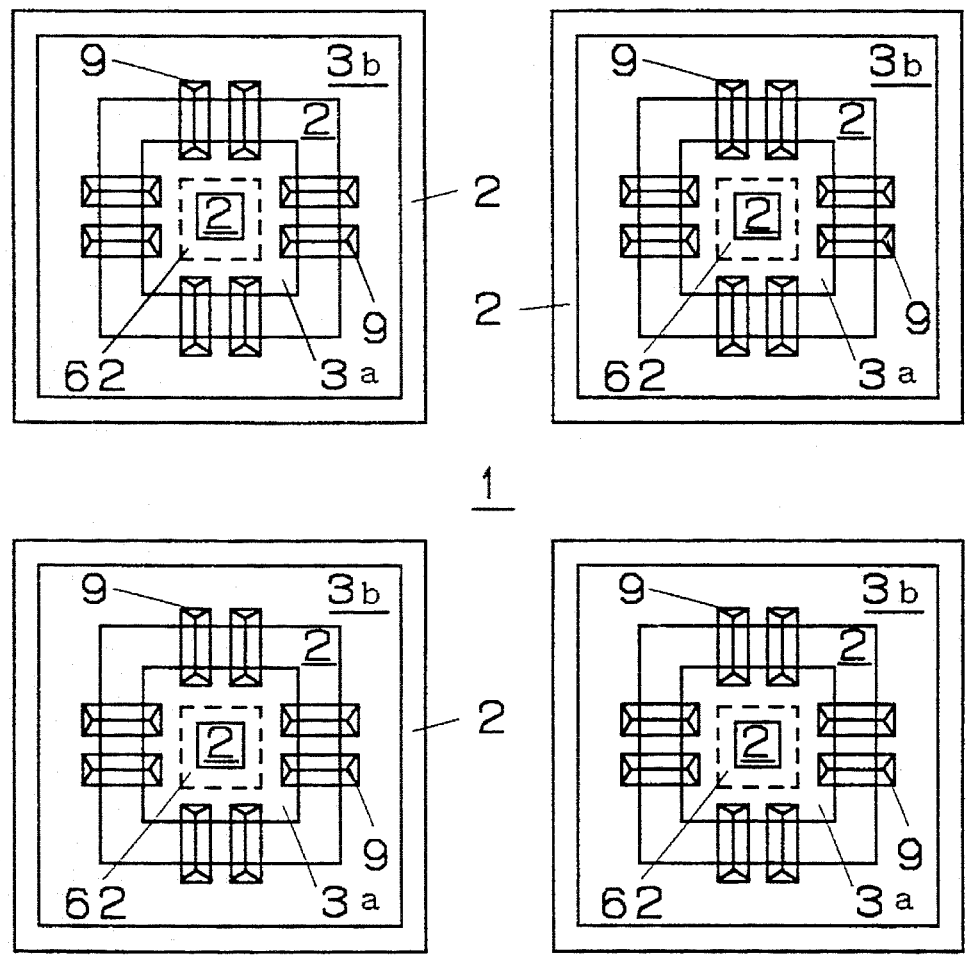
FIG. 21 is a plan view showing an eighth embodiment of the present invention.
Figure 22:
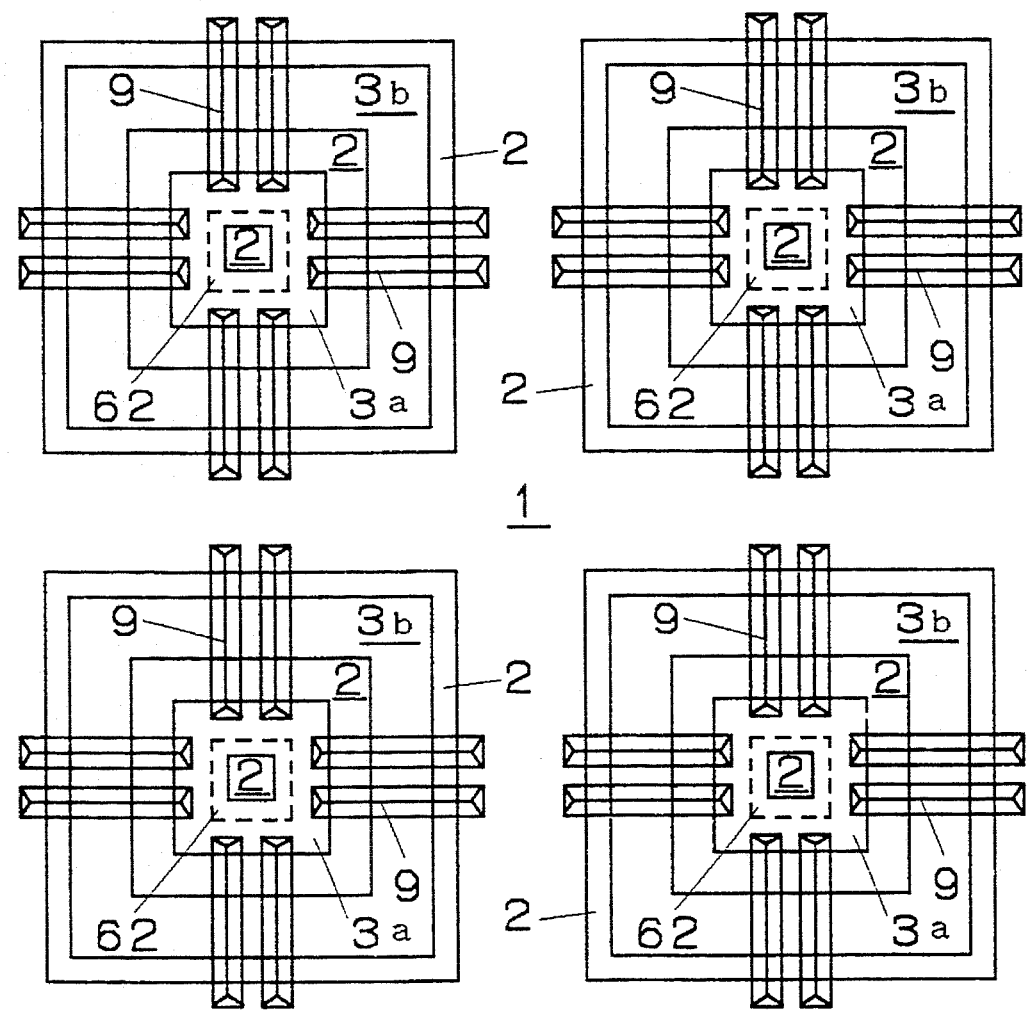
FIG. 22 is a plan view showing the eighth embodiment of the present invention.

FIGS. 21 and 22 are plan views showing semiconductor devices according to an eighth embodiment of the present invention. The semiconductor devices according to the eighth embodiment correspond to the EST 104 (shown in FIG. 14) and the EST 105 (shown in FIG. 15) according to the fourth embodiment respectively. Namely, n⁺-type layers 13 (not shown) and p⁺-type substrates 10 (not shown) are formed under n⁻-type epitaxial layers 1. While oxide films 4, gate electrodes 5 and source electrodes 6 are omitted in FIGS. 21 and 22 for the purpose of simplification, the source electrodes 6 are connected to p-type and n⁺-type diffusion regions 2 and 3 in regions 62 enclosed by broken lines.

While the p-type and n⁺-type diffusion regions 2, 3a and 3b are in the form of strips in the ESTs 104 and 105, such regions have cell structures in the eighth embodiment. Thus, the operation of the eighth embodiment is similar to that described above with reference to the fourth embodiment, and a similar effect is attained.

Ninth Embodiment

Figure 23:
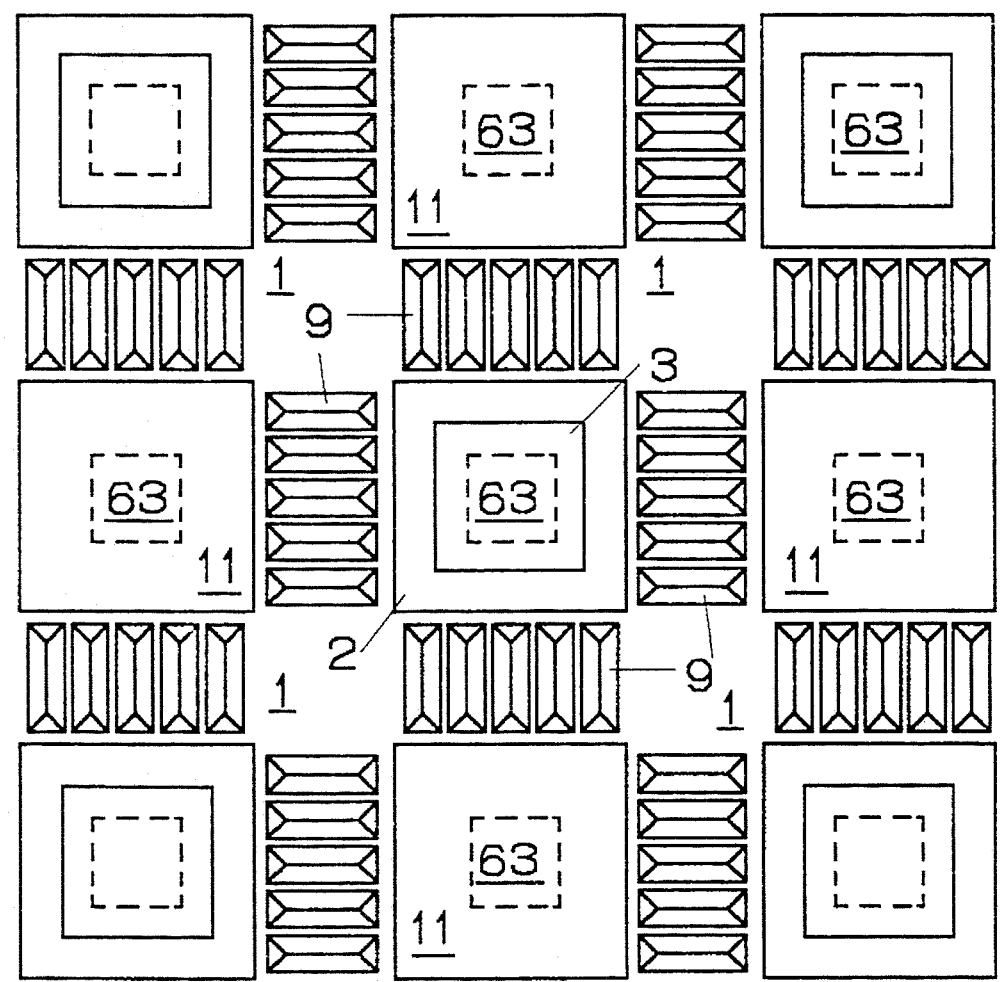
FIG. 23 is a plan view showing a ninth embodiment of the present invention.
Figure 24:
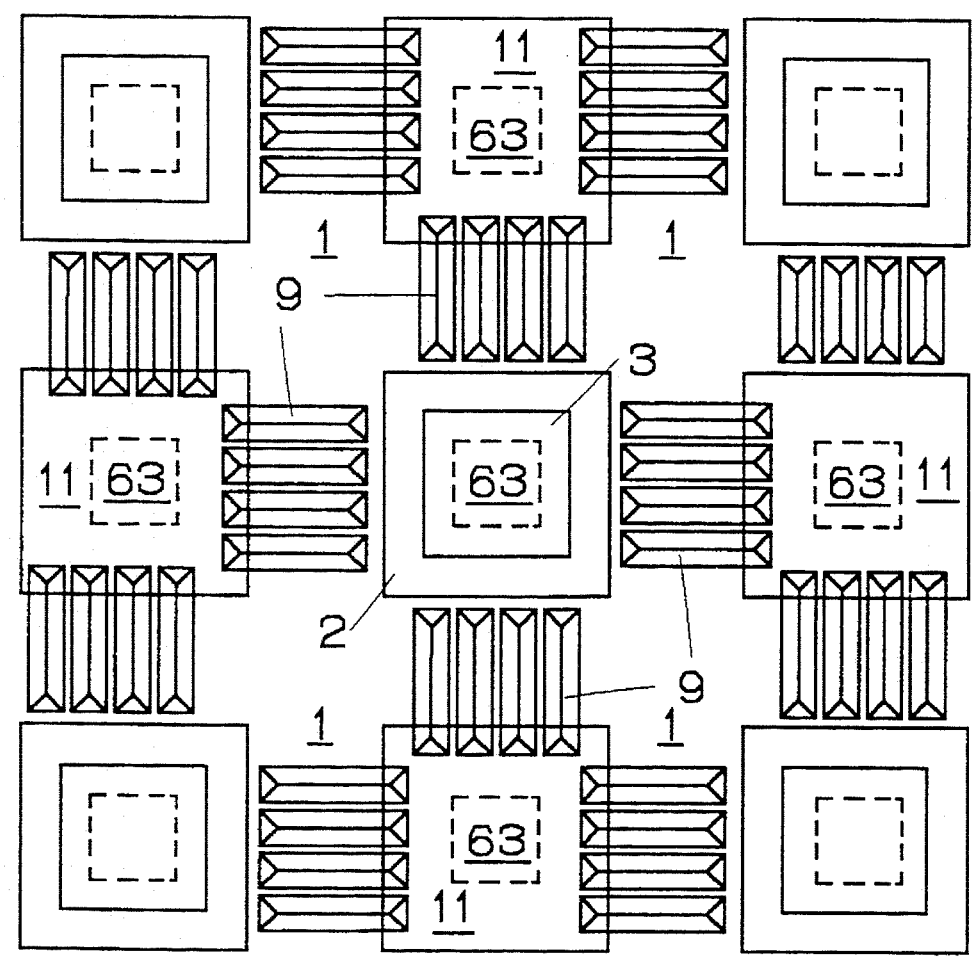
FIG. 24 is a plan view showing the ninth embodiment of the present invention.
Figure 25:
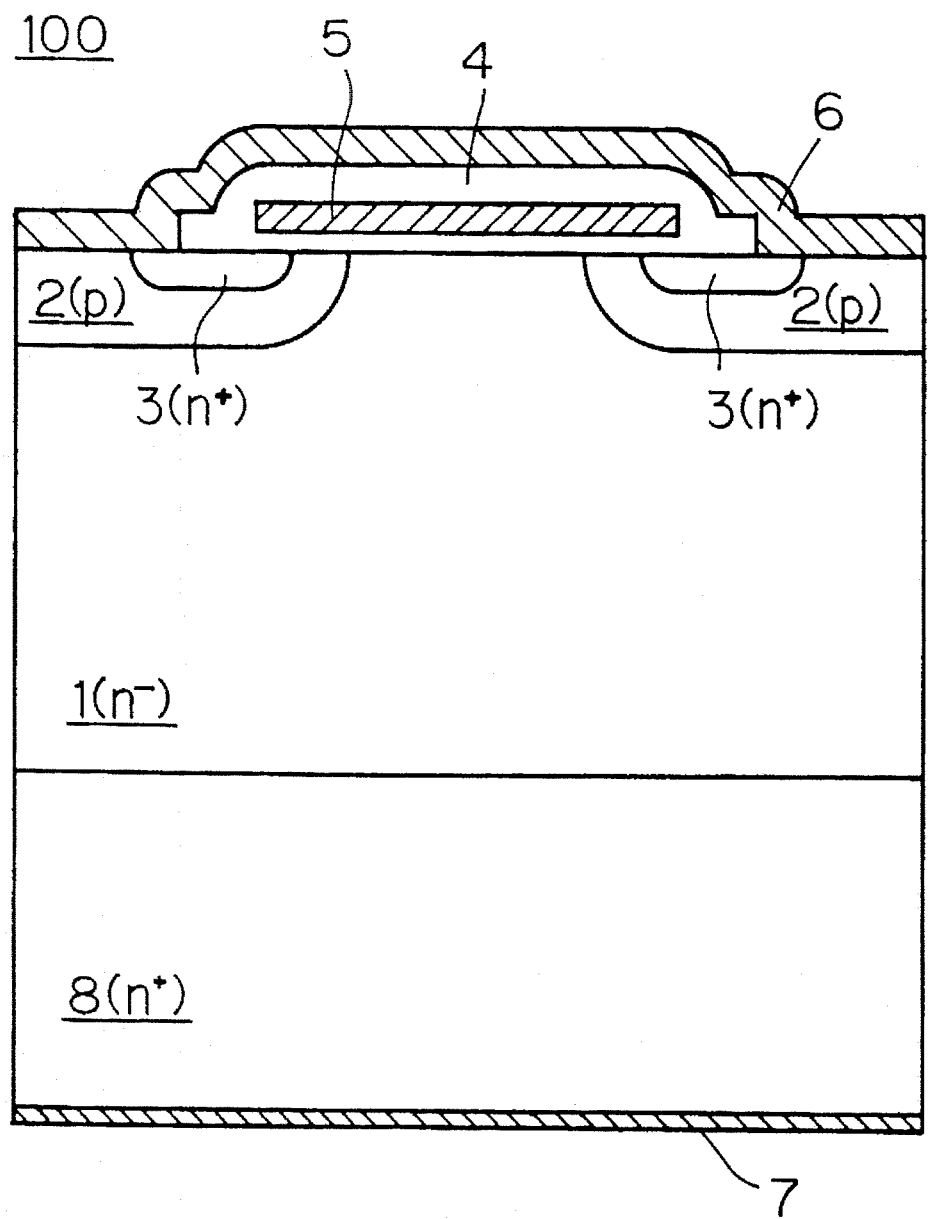
FIG. 25 is a local sectional view illustrating a conventional semiconductor device.
Figure 26:
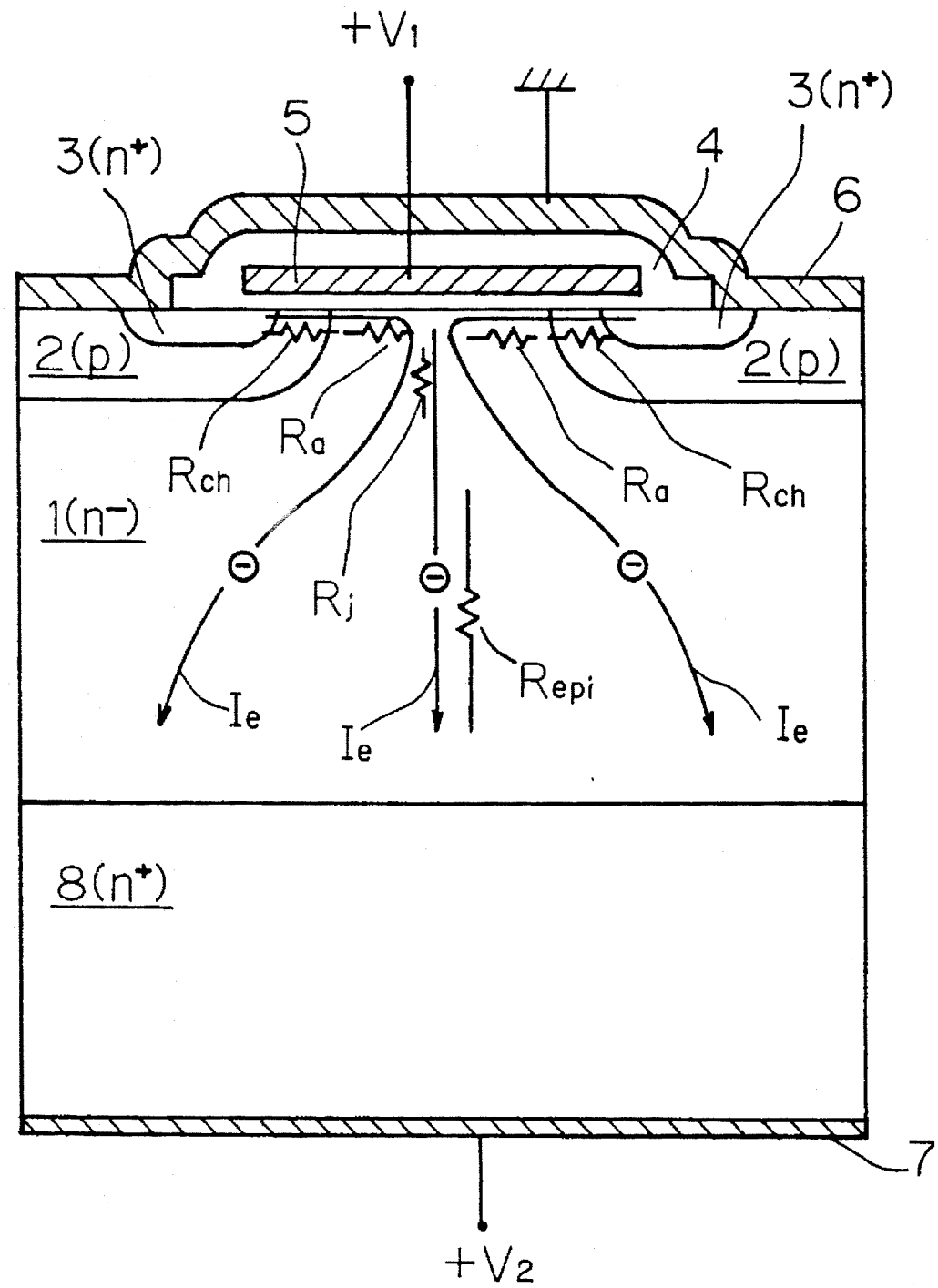
FIG. 26 is a local sectional view illustrating the conventional semiconductor device.

FIGS. 23 and 24 are plan views showing semiconductor devices according to a ninth embodiment of the present invention. The semiconductor devices according to the ninth embodiment correspond to the MCT 106 (shown in FIG. 17) and the MCT 107 (shown in FIG. 18) according to the fifth embodiment respectively. Namely, n⁺-type layers 13 (not shown) and p⁺-type substrates 10 (not shown) are formed under n⁻-type epitaxial layers 1. While oxide films 4, gate electrodes 5 and source electrodes 6 are omitted in FIGS. 23 and 24 for the purpose of simplification, the source electrodes 6 are connected to p-type diffusion regions 2 and 11 in regions 63 enclosed by broken lines.

While-the p-type and n⁺-type diffusion regions 2, 11 and 3 are in the form of strips in the MCTs 106 and 107, such regions have cell structures in the ninth embodiment. Thus, the structures shown in FIGS. 23 and 24 are different from the MCTs 106 and 107 only in the point that p-type diffusion regions 2 and 11 are islanded so that n⁺-type diffusion regions 3 are checkered therein. Thus, the operation of the ninth embodiment is similar to that described above with reference to the fifth embodiment, and a similar effect is attained.

While the invention has been shown and described in detail, the foregoing description is in all aspects illustrative and not restrictive. It is therefore understood that numerous modifications and variations can be devised without departing from the scope of the invention.

I claim:

1. A semiconductor device comprising:

a first conductivity type first semiconductor layer having an upper surface provided with at least one groove;

a plurality of second conductivity type second semiconductor layers having exposed surfaces selectively exposed on said upper surface of said first semiconductor layer so that a boundary line substantially perpendicular to a longitudinal direction of said groove is defined between each of said second semiconductor layers and said first semiconductor layer on said upper surface of said first semiconductor layer;

a plurality of first conductivity type third semiconductor layers selectively formed on upper surfaces of respective of said second semiconductor layers;

a control insulating film formed on an upper surface of said groove and on said second semiconductor layers; and a control electrode formed on said control insulating film;

wherein said groove is formed only on said upper surface of said first semiconductor layer held between a respective pair of said second semiconductor layers and has a side wall extending along said longitudinal direction of said groove towards said respective pair of said second semiconductor layers.

2. A semiconductor device in accordance with claim 1, further comprising:

a first electrode being insulated from said control electrode and connected to said second and third semiconductor layers, and a second electrode being electrically connected to said first semiconductor layer.

3. A semiconductor device in accordance with claim 2, further comprising a first conductivity type fourth semiconductor layer, being formed between said first semiconductor layer and said second electrode, having higher impurity concentration than said first semiconductor layer.

4. A semiconductor device in accordance with claim 2, further comprising a second conductivity type fourth semiconductor layer being formed between said first semiconductor layer and said second electrode.

5. A semiconductor device in accordance with claim 1, wherein said second semiconductor layers are in the form of islands on said upper surface of said first semiconductor layer.

6. A semiconductor device comprising:

a first conductivity type first semiconductor layer having an upper surface provided with at least one groove;

a plurality of second conductivity type second semiconductor layers having selectively exposed surfaces on said upper surface of said first semiconductor layer so that a boundary line substantially perpendicular to a longitudinal direction of the groove is defined between each of said second semiconductor layers and said first semiconductor layer on said upper surface of said first semiconductor layer;

a plurality of first conductivity type third semiconductor layers selectively formed on upper surfaces of respective of said second semiconductor layers;

a control insulating film formed on said upper surface of said groove and on said second semiconductor layers;

each said third semiconductor layer formed to include a part of said groove; and wherein said second semiconductor layers are in the form of islands on said upper surface of said first semiconductor layer;

wherein said groove is formed on said upper surface of said first semiconductor layer held between said second semiconductor layers and on said second semiconductor layers and has a side wall extending along said longitudinal direction of said groove perpendicular to said boundary line and towards said second semiconductor layers.

7. A semiconductor device comprising:

a first conductivity type first semiconductor layer having an upper surface provided with a plurality of grooves;

a plurality of second conductivity type second semiconductor layers having exposed surfaces selectively exposed on said upper surface of said first semiconductor layer so that a boundary line substantially perpendicular to a longitudinal direction of each of said grooves is defined between each of said second semiconductor layers and said first semiconductor layer on said upper surface of said first semiconductor layer;

a first conductivity type third semiconductor layer selectively formed on an upper surface of at least one of said second semiconductor layers;

a control insulating film formed on an upper surface of said grooves and on said second semiconductor layers; and a control electrode formed on said control insulating film;

wherein said plurality of said grooves are formed on at least one of said plurality of said second semiconductor layers other than said at least one of said second semiconductor layers having said third semiconductor layer formed on said upper surface and on said upper surface of said first semiconductor layer held between said second semiconductor layers and each of said grooves has a side wall extending along said longitudinal direction of each said groove towards said second semiconductor layers.

8. A semiconductor device in accordance with claim 7, wherein said second semiconductor layers are in the form of islands on said upper surface of said first semiconductor layer.

9. A semiconductor device in accordance with claim 24, wherein said at least one second semiconductor layer having said third semiconductor layer formed on its upper surface and others of said second semiconductor layers not having said third semiconductor layer formed on their upper surfaces are checkered on said upper surface of said first semiconductor layer.

10. A semiconductor device comprising:

a first conductivity type first semiconductor layer having an upper surface provided with at least one groove;

plural second conductivity type second semiconductor layers selectively formed in said first semiconductor layer and having exposed surfaces selectively exposed on said upper surface of said first semiconductor layer so that a boundary line substantially perpendicular to a longitudinal direction of said groove is defined between each of two of said second semiconductor layers and the first semiconductor layer on said upper surface of said first semiconductor layer;

a control insulating film formed on at least an upper surface of said groove;

a control electrode formed on said control insulating film;

a second conductivity type third semiconductor layer, wherein said first semiconductor layer is selectively formed on an upper surface of said third semiconductor layer and has an upper surface portion lying between an upper surface portion of one of said two second semiconductor layers and an upper surface portion of said third semiconductor layer, and said control insulating film is formed on said upper surface portion of said first semiconductor layer;

wherein said groove is formed at least on said upper surface of said first semiconductor layer held between said two of said second semiconductor layers and has a side wall extending along said longitudinal direction of said groove perpendicular to said boundary line and towards said two second semiconductor layers.

11. A semiconductor device in accordance with claim 10, further comprising:

a first electrode being insulated from said control electrode and connected to said first semiconductor layer and the other one of said two of said second semiconductor layers holding said groove, and a second electrode being electrically coupled to said third semiconductor layer.

12. A semiconductor device in accordance with claim 11, further comprising a second conductivity type fourth semiconductor layer, being formed between said third semiconductor layer and said second electrode, having higher impurity concentration than said third semiconductor layer.

13. A semiconductor device in accordance with claim 11, further comprising a first conductivity type fourth semiconductor layer being formed between said third semiconductor layer and said second electrode.

14. A semiconductor device in accordance with claim 10, wherein said first semiconductor layer is in the form of an island on said upper surface of said third semiconductor layer.

15. A semiconductor device in accordance with claim 10, wherein:

said at least one groove comprises a plurality of grooves, and said grooves are formed also over said first semiconductor layer and said third semiconductor layer.

16. A semiconductor device in accordance with claim 15, wherein said first semiconductor layer is in the form of an island on said upper surface of said third semiconductor layer.

17. A semiconductor device in accordance with claim 15, further comprising:

a first electrode being insulated from said control electrode and connected to said first semiconductor layer and the other one of said two of said second semiconductor layers holding said groove, and a second electrode being electrically couple to said third semiconductor layer.

* * * * *

UNITED STATES PATENT AND TRADEMARK OFFICE
CERTIFICATE OF CORRECTION

PATENT NO.   : 5,541,430
DATED        : July 30, 1996
INVENTOR(S)  : Tomohide TERASHIMA It is certified that error appears in the above-indentified patent and that said Letters Patent is hereby corrected as shown below:

In column 16, line 37, change "24" to --8--.

Signed and Sealed this

Twenty-sixth Day of August, 1997

Attest:

BRUCE LEHMAN

Attesting Officer      Commissioner of Patents and Trademarks